(12) United States Patent
Yun et al.

(10) Patent No.: US 7,943,998 B2
(45) Date of Patent: *May 17, 2011

(54) NONVOLATILE MEMORY DEVICES HAVING STACKED STRUCTURES AND METHODS OF FABRICATING THE SAME

(75) Inventors: Eun-Jung Yun, Seoul (KR); Sung-Young Lee, Gyeonggi-do (KR); Min-Sang Kim, Seoul (KR); Sung-Min Kim, Incheon (KR); Kyoung-Hwan Yeo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 256 days.

This patent is subject to a terminal disclaimer.

(21) Appl. No.: 11/668,115

(22) Filed: Jan. 29, 2007

(65) Prior Publication Data

US 2008/0087941 A1     Apr. 17, 2008

(30) Foreign Application Priority Data

Aug. 4, 2006    (KR) .................. 10-2006-0073731

(51) Int. Cl.
*H01L 29/66* (2006.01)
*H01L 29/792* (2006.01)

(52) U.S. Cl. ........ 257/365; 257/366; 257/314; 257/324; 257/E21.18; 257/E21.21; 257/E21.423; 257/E21.679

(58) Field of Classification Search .................. 257/250, 257/215, 216, 262, 329, 393, 903, 320, 319, 257/214, 314, 315, E21.179, 365, 366, 324, 257/E29.309, E21.679, 347, E21.423; 438/257, 264

See application file for complete search history.

(56) References Cited

U.S. PATENT DOCUMENTS

| | | | | |
|---|---|---|---|---|
| 5,612,552 A * | 3/1997 | Owens | .......................... | 257/202 |
| 5,719,425 A * | 2/1998 | Akram et al. | .................. | 257/344 |
| 6,429,110 B1 * | 8/2002 | Tseng | .......................... | 438/592 |
| 6,432,754 B1 * | 8/2002 | Assaderaghi et al. | ........ | 438/149 |
| 6,667,201 B2 * | 12/2003 | Jang | ............................ | 438/201 |
| 7,002,207 B2 | 2/2006 | Kim et al. | | |
| 2003/0107091 A1 * | 6/2003 | Breitwisch et al. | ........... | 257/384 |
| 2004/0063286 A1 * | 4/2004 | Kim et al. | .................... | 438/283 |
| 2005/0227435 A1 * | 10/2005 | Oh et al. | ....................... | 438/257 |
| 2008/0142904 A1 * | 6/2008 | Li et al. | ....................... | 257/387 |

FOREIGN PATENT DOCUMENTS

JP     4094168     * 3/1992

* cited by examiner

*Primary Examiner* — Lynne A Gurley
*Assistant Examiner* — Jesse Y Miyoshi
(74) *Attorney, Agent, or Firm* — Myers Bigel Sibley & Sajovec, P.A.

(57) ABSTRACT

A memory device includes a first active region on a substrate and first and second source/drain regions on the substrate abutting respective first and second sidewalls of the first active region. A first gate structure is disposed on the first active region between the first and second source/drain regions. A second active region is disposed on the first gate structure between and abutting the first and second source/drain regions. A second gate structure is disposed on the second active region overlying the first gate structure.

19 Claims, 22 Drawing Sheets

NONVOLATILE MEMORY DEVICES HAVING STACKED STRUCTURES AND METHODS OF FABRICATING THE SAME

CROSS-REFERENCE TO RELATED APPLICATION

This application claims the benefit of Korean Patent Application No. 2006-73731, filed on Aug. 4, 2006, in the Korean Intellectual Property Office, the disclosure of which is incorporated herein in its entirety by reference.

BACKGROUND OF THE INVENTION

The present invention relates to semiconductor devices and methods of fabrication therefor, and more particularly, to nonvolatile memory devices and methods of fabrication therefor.

Floating gate field effect transistors are widely used in integrated circuit memory devices. A typical floating gate integrated circuit field effect transistor includes spaced apart source and drain regions, an active (channel-supporting) region therebetween and a gate structure including a tunnel oxide layer on the channel, a floating gate (charge trap) layer on the tunnel oxide layer, a dielectric layer on the floating gate layer, and a control gate electrode on the dielectric layer.

There has been an ever-present drive to increase the amount of memory capacity that can be provided in a given amount of space. Thus, the size of memory cells has been decreased. In addition, cell architectures that can increase effective use of wafer area, such as stackable cell architectures, have also been employed.

SUMMARY OF THE INVENTION

In some embodiments of the present invention, a memory device includes a first active region on a substrate and first and second source/drain regions on the substrate abutting respective first and second sidewalls of the first active region. A first gate structure is disposed on the first active region between the first and second source/drain regions. A second active region is disposed on the first gate structure between and abutting the first and second source/drain regions. A second gate structure is disposed on the second active region overlying the first gate structure. The first gate structure may include a first elongate conductive gate electrode, a dielectric layer surrounding the first elongate conductive gate electrode region, a charge trap layer surrounding the dielectric layer and the first elongate conductive gate electrode, and a tunnel oxide layer surrounding the charge trap layer, the dielectric layer, and the first elongate conductive gate electrode. The second gate structure may include a tunnel oxide pattern on the second active region, a charge trap pattern on the tunnel oxide pattern, a dielectric pattern on the charge trap pattern, and a second elongate conductive gate electrode on the dielectric pattern and substantially parallel to the first elongate conductive gate electrode.

In further embodiments, each of the first and second source/drain regions may include a first subregion disposed adjacent the second gate structure and having a first impurity concentration and a second subregion adjacent the first gate structure and having a second impurity concentration. The first and second source/drain regions may include single crystal semiconductor regions. The first and second source/drain regions may be bounded by spaced-apart trench isolation regions.

According to further embodiments, the first and second gate structures are substantially parallel elongate gate structures, and a portion of the first gate structure extends beyond an end of the second gate structure. The memory device may further include an interlayer dielectric (ILD) layer covering the second gate structure and a conductive wiring structure disposed on the ILD layer and having a contact plug extending through the ILD layer to contact the portion of the first gate structure that extends beyond the end of the second gate structure.

In additional embodiments of the present invention, the memory device may further include a third gate structure underlying the first active region. The third gate structure may include a charge trap structure underlying the first active region and a doped control gate region in the substrate underlying the charge trap structure. The charge trap structure may include a charge trap layer surrounded by a tunnel oxide layer. The charge trap structure may underlie the first active region between the first and second source/drain regions. In some embodiments, the charge trap structure extends to underlie the first and second source/drain regions and the first active region. In further embodiments, each of the first and second source/drain regions may include a first subregion adjacent the second gate structure and having a first impurity concentration, a second subregion adjacent the first gate structure and having a second impurity concentration and a third subregion adjacent the third gate structure and having a third impurity concentration.

In some embodiments of the present invention, a memory device includes a doped control gate region in a substrate and a charge trap structure on the doped control gate region. The device also includes a first active region on the charge trap structure, first and second source/drain regions on the substrate abutting respective first and second sidewalls of the first active region, and a first gate structure on the first active region between the first and second source/drain regions. The device further includes a second active region on the first gate structure between and abutting the first and second source/drain regions and a second gate structure disposed on the second active region, overlying the first gate structure.

Some embodiments of the present invention provide methods of fabricating a memory cell. A stack of layers is formed, including at least two semiconductor layers with at least one sacrificial layer therebetween. Spaced-apart trench isolation regions are formed, each extending through the stack of layers. The stack of layers is patterned to form a stack of patterns including at least two semiconductor patterns and at least one sacrificial pattern therebetween and spaced-apart first and second recesses disposed at respective sides of the stack of patterns and bounded by the trench isolation regions. First and second source/drain regions are formed in respective ones of the first and second recesses. Portions of the trench isolation regions on respective third and fourth sides of the stack of patterns are removed to expose a sacrificial pattern of the stack of patterns at first and second ends thereof. The exposed sacrificial pattern is removed to form a passage between first and second semiconductor patterns of the stack of patterns. A first gate structure is formed in the passage, and a second gate structure is formed overlying the first gate structure on an upper one of the first and second semiconductor patterns.

In some embodiments, forming a stack of layers includes alternately forming single crystal semiconductor layers of first and second types by epitaxial growth. Alternately forming single crystal semiconductor layers of first and second types by epitaxial growth may include alternately forming single silicon-germanium and silicon layers.

Patterning the stack of layers may include forming an elongate gate mask region on the stack of layers, the gate mask region extending transverse to the trench isolation regions and etching the stack of layers using the gate mask region as an etching mask. The gate mask region may include a dummy gate structure.

In further embodiments, forming first and second source/drain regions may include forming respective first and second single crystal semiconductor regions in the respective first and second recesses by epitaxial growth. First and second subregions may be formed in each of the first and second source drain regions adjacent respective ones of the second gate structure and the first gate structure, the first subregion having a first impurity concentration and the second subregion having a second impurity concentration. The first and second subregions may be formed by ion implantation and/or in situ doping.

Removing portions of the trench isolation regions on respective third and fourth sides of the stack of patterns may include forming respective first and second mask regions on respective sides of the gate mask region, the first and second mask regions covering respective ones of first and second source/drain regions and adjacent portions of the trench isolation regions, removing the gate mask region and etching using the first and second mask regions as a mask to remove the portions of the trench isolation regions on the respective third and fourth sides of the stack of patterns.

In further embodiments, a third gate structure may be formed underlying a lower one of the first and second semiconductor patterns. Forming a stack of layers may be preceded by forming a doped control gate region in the substrate, and forming a stack of layers may include forming a stack of layers including at least two semiconductor layers and at least two sacrificial layers including a lower sacrificial layer most adjacent the doped control gate region. Patterning the stack of layers to form a stack of patterns may include patterning some of the stack of layers to form a stack of patterns on the lower sacrificial layer and overlying the doped control gate region, the stack of layers including at least two semiconductor patterns and at least one sacrificial pattern therebetween, and to form spaced-apart first and second recesses at respective sides of the stack of patterns and bounded by the trench isolation regions and the lower sacrificial layer.

Forming first and second source/drain regions in respective ones of the first and second recesses may include forming first and second source/drain regions in respective ones of the first and second recesses and on the lower sacrificial layer. Removing portions of the trench isolation regions on respective third and fourth sides of the stack of patterns to expose a sacrificial pattern of the stack of patterns at first and second ends thereof may include removing portions of the trench isolation regions on respective third and fourth sides of the stack of patterns to expose a sacrificial pattern of the stack of patterns at first and second ends thereof and to expose the lower sacrificial layer. Removing the exposed sacrificial pattern to form a passage between first and second semiconductor patterns of the stack of patterns may include removing the exposed sacrificial pattern and a portion of the lower sacrificial layer to form a first passage between first and second semiconductor patterns of the stack of patterns and a second passage between a lower one of the first and second semiconductor patterns and the doped control gate region. Forming a first gate structure may include forming the first gate structure in the first passage. The methods may further include forming a charge trap structure in the second passage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
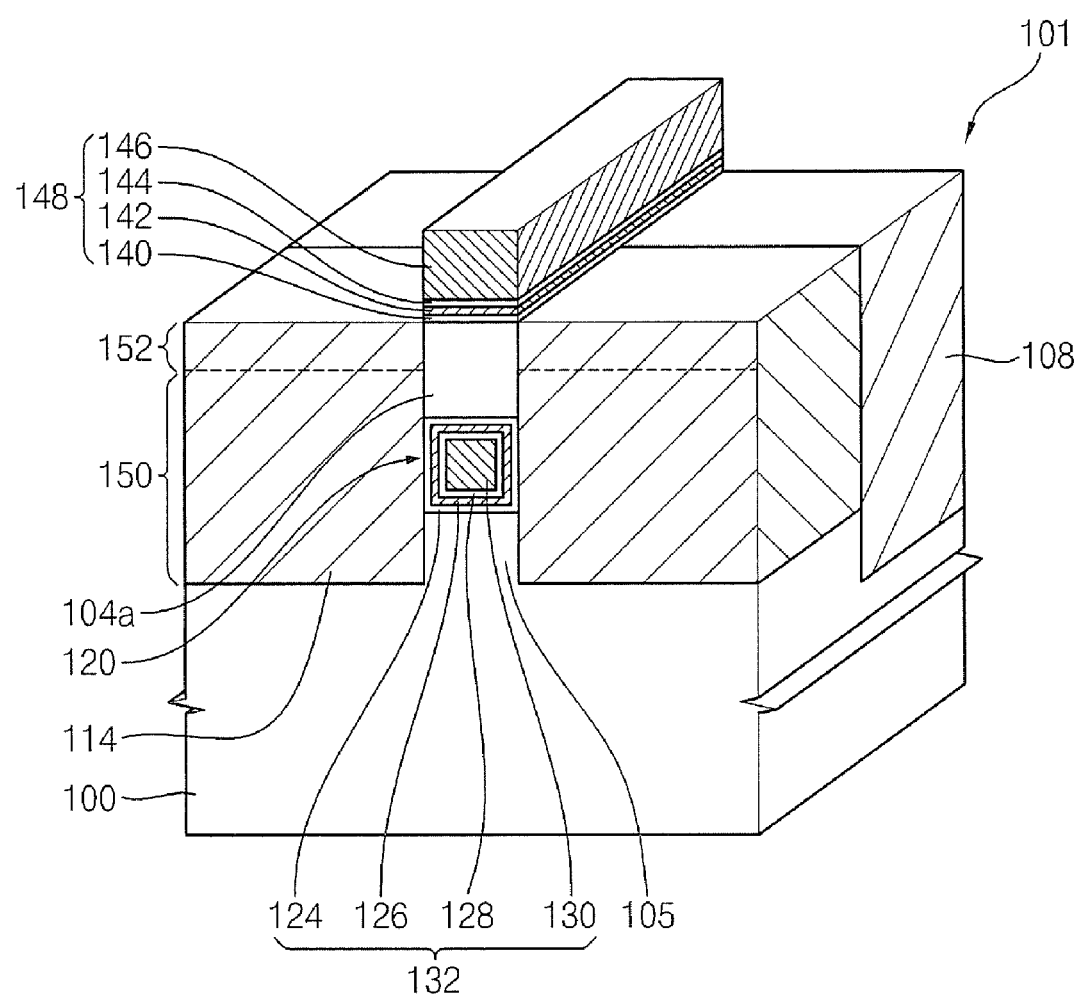
FIG. 1 illustrates a nonvolatile memory device according to some embodiments of the present invention.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the present invention are described herein with reference to perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

FIG. 1 illustrates a nonvolatile memory device 101 according to some embodiments of the present invention. The memory device 101 includes first and second gate structures 132, 148 on a substrate 100. The first gate structure 132 is part of a vertical transistor that includes source/drain subregions 152 on respective sides of the first gate structure 132. The second gate structure 148 is part of a planar transistor including source/drain subregions 150 on respective sides of the second gate structure 148. In the illustrated embodiments, the source/drain subregions 150, 152 are parts of source/drain regions 154, which may be continuous semiconductor regions that are partitioned into the two source/drain subregions 150, 152. For example, the source/drain subregions 150, 152 may have respective different impurity concentrations, depending on the characteristics desired for the respective vertical and planar transistors. The source/drain subregions 150, 152 are bounded by a device isolation region 108.

A first active (channel-supporting) region 105 underlies the first gate structure 132, while a second active region 104a is disposed between the first and second gate structures 132, 148. As illustrated, the first active region 105 may include a portion of the substrate 100 protruding between the source/drain regions 154. It will be appreciated that the first active region 105 and a portion of the second active region 104a may support a channel for the planar transistor that includes the first gate structure 132 and source/drain subregions 150, while a portion of the second active region 104a may support a channel for the planar transistor including the second gate structure 148 and the source/drain subregions 152.

In the illustrated embodiments, the first gate structure 132 has a multi-layer structure including a tunnel oxide pattern 124, an electron trap pattern 126 and a dielectric pattern 128, which surround a gate electrode 130. The second gate structure 148 includes a gate electrode 146 disposed on a dielectric pattern 144, a charge trap pattern 142 and a tunnel oxide pattern 140.

Figure 2:
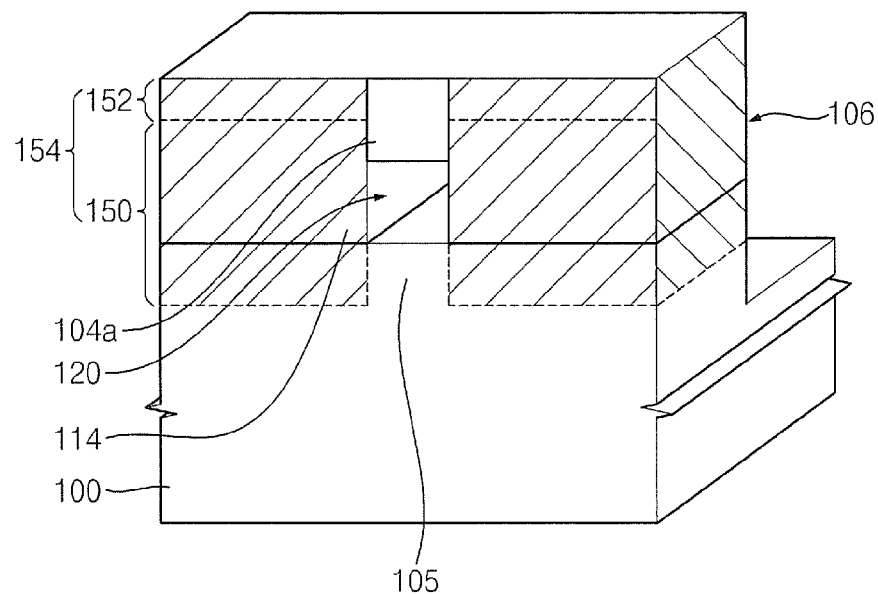
FIGS. 2-14 illustrate fabrication products illustrating operations for forming the memory device of FIG. 1 according to some embodiments of the present invention.

FIG. 2 illustrates the structure shown in FIG. 1 with the first and second gate structures 132, 148 and the device isolation region 108 removed. Referring to FIGS. 1 and 2, the first gate structure 132 is formed in a passage 120 disposed between the first active region 105 and the second active region 104a and that extends to a trench 106 within which the device isolation region 108 is formed.

Figure 3:
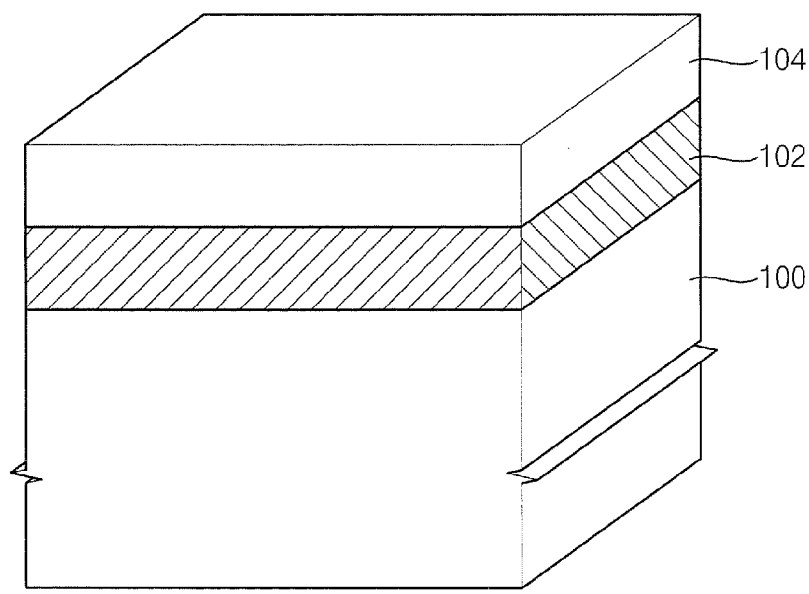
Figure 4:
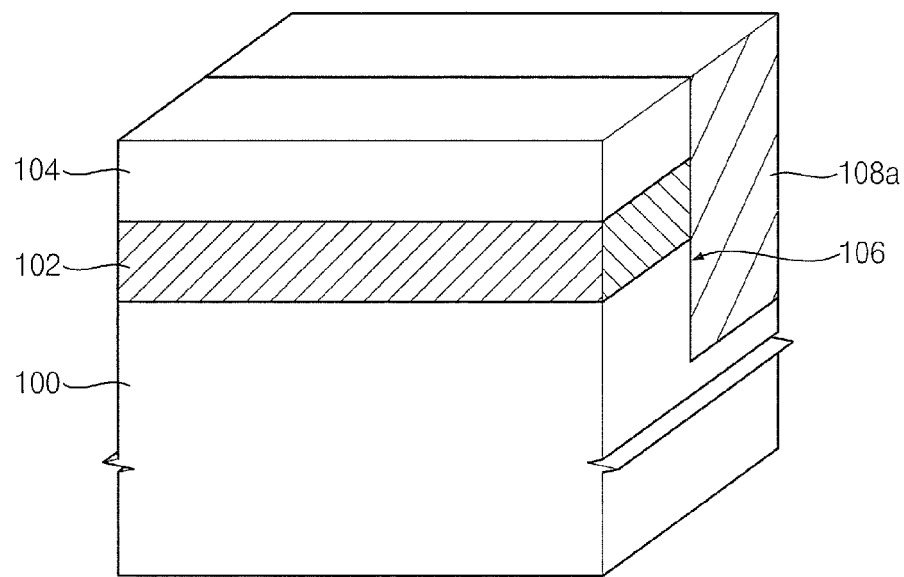
Figure 5:
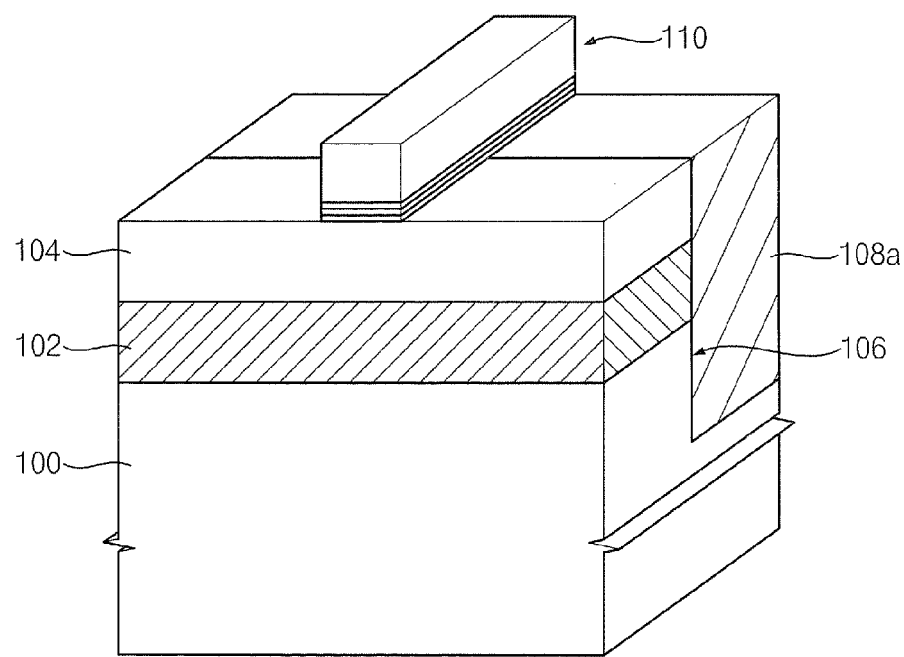
Figure 6:
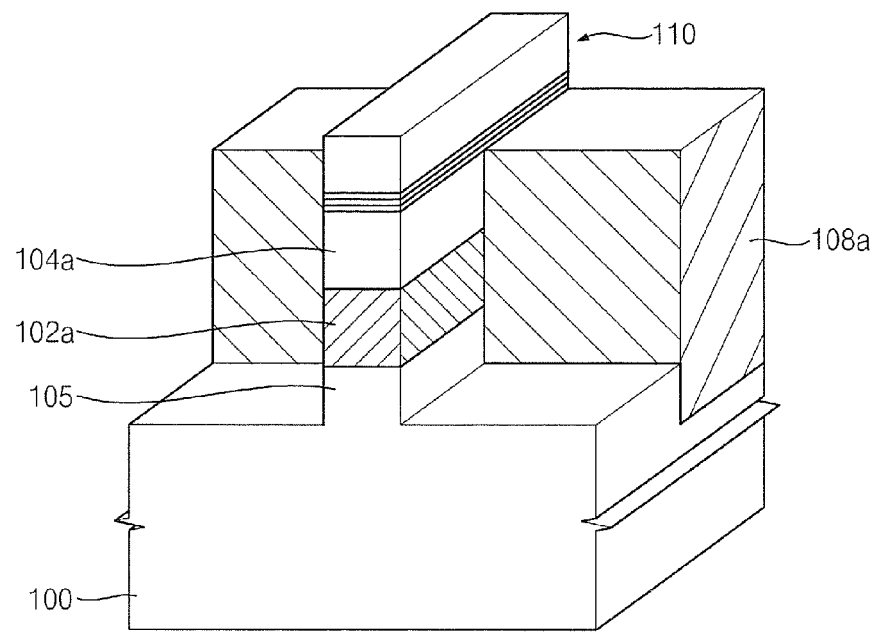

FIGS. 3-14 illustrate operations for forming the memory device 101 of FIG. 1. Referring to FIGS. 3 and 4, a sacrificial layer 102 is formed on a substrate 100 using, for example, an epitaxial process. The sacrificial layer 102 may include, for example, a silicon-germanium (SiGe) layer. A semiconductor layer, e.g., a single crystal silicon layer 104, is formed on the sacrificial layer 102 using, for example, an epitaxial process. A trench 106 is formed through the sacrificial layer 102 and the semiconductor layer 104, and a shallow trench isolation (STI) region 108a is formed in the trench 106. Referring to FIGS. 5 and 6, a dummy gate structure 110 is formed on the silicon layer 104 and the STI region 108a using, for example, a chemical vapor deposition (CVD), photo and etch process. A first active region 105, a sacrificial region 102a and a second active region 104a are formed by etching using the dummy gate structure 110 as a mask.

Figure 7:
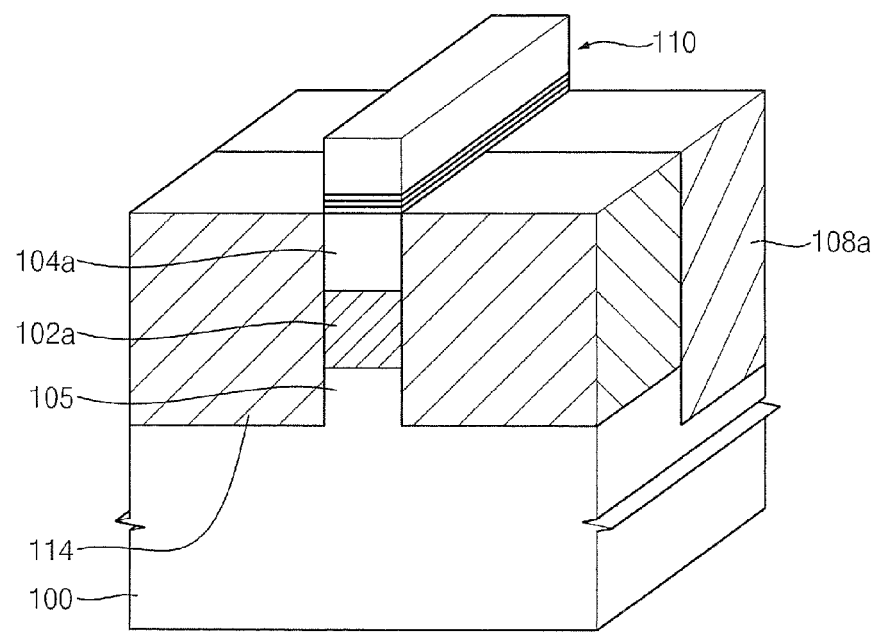
Figure 8:
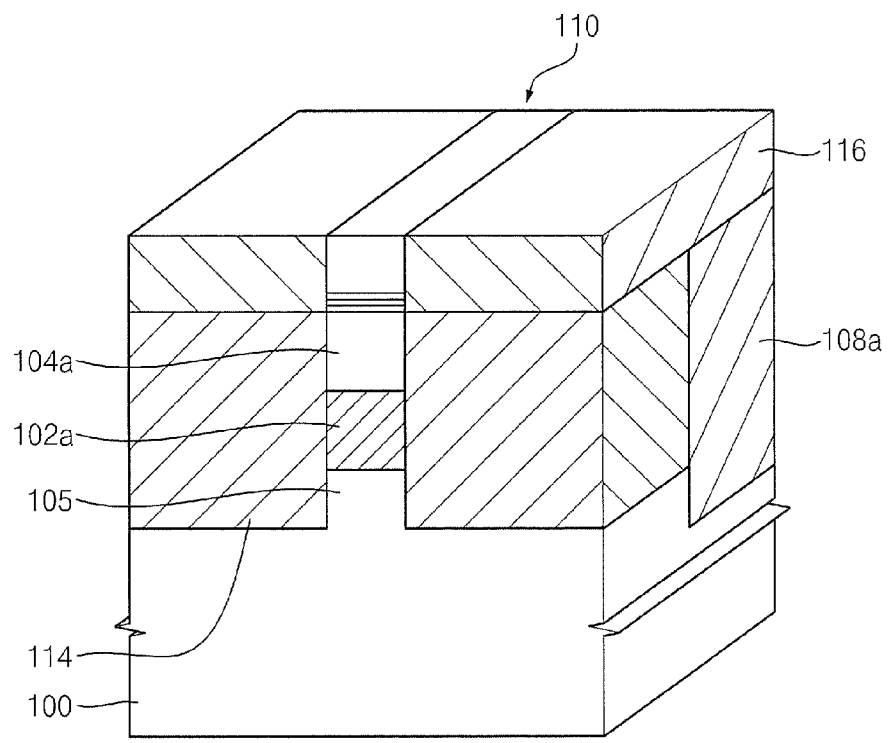

Referring to FIGS. 7 and 8, semiconductor (e.g., silicon) regions 114 are formed on sidewalls of the first active region 105, the sacrificial region 102a and the second active region 104a using, for example, an epitaxial process. Respective mask regions 116 are formed on respective ones of the semiconductor regions 114 and extending on to the STI region 108a. The mask regions may be formed using, for example, a CVD and CMP process. The mask regions 116 may include, for example, silicon nitride. The semiconductor regions 114, in which source/drain regions for the device are to be formed, may be doped in situ and/or ion-implanted to form source/drain subregions.

Figure 9:
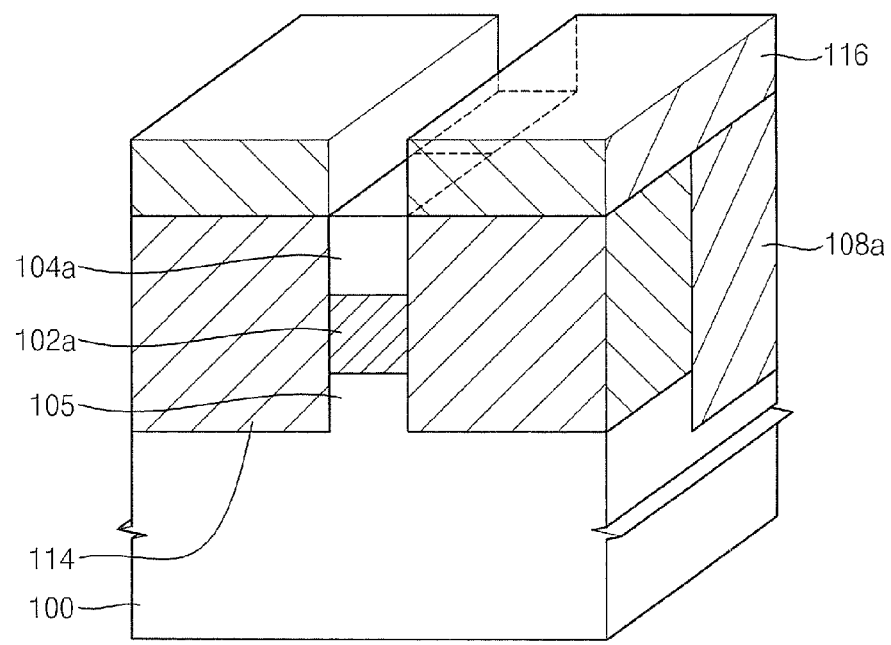
Figure 10:
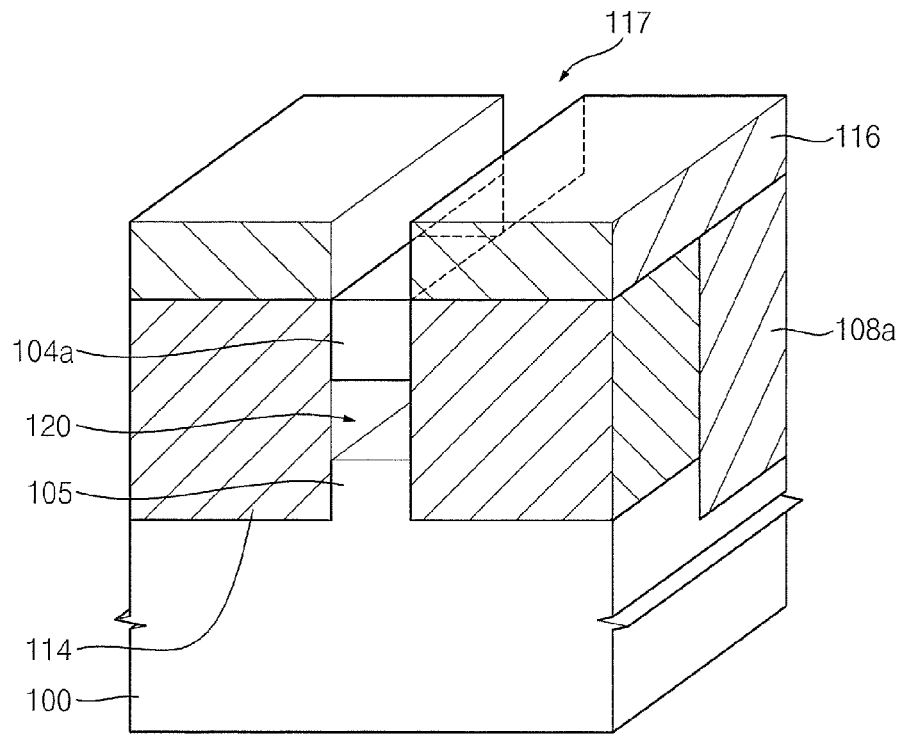

Referring to FIGS. 9 and 10, the dummy gate structure 110 may be removed using, for example, a wet etch process. A portion of the STI region 108a between the mask regions 116 may also be removed to form a trench 117 in the STI region 108a. The sacrificial region 102a may be removed using, for example, a dry etch process. As a result, a passage 120 is formed between the first and second active regions 105, 104a, in communication with the trench 117 in the STI region 108.

Figure 11:
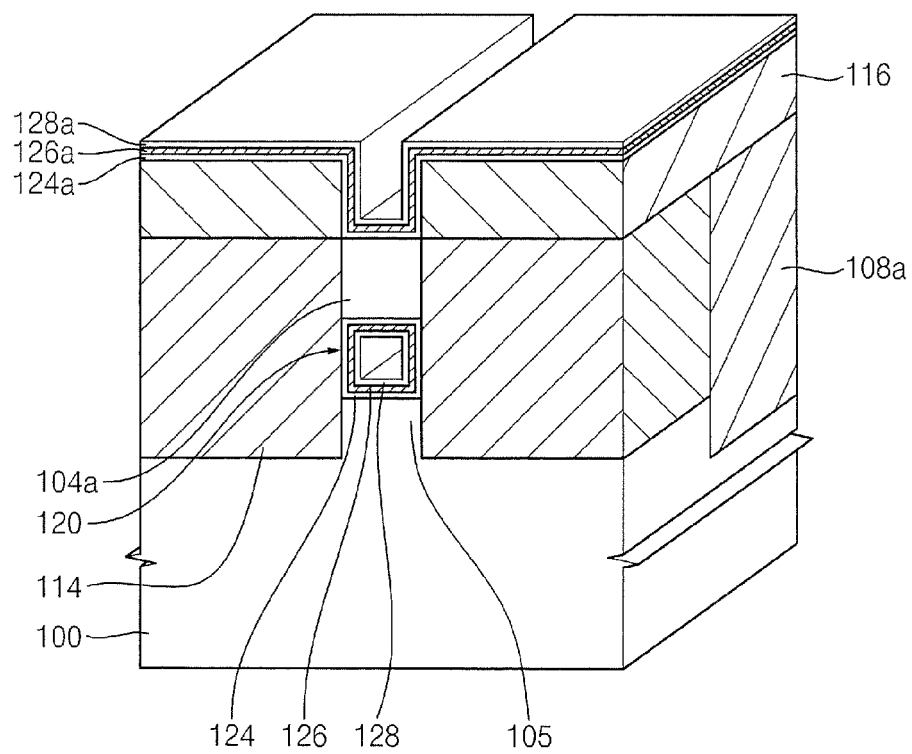

As shown in FIG. 11, a tunnel oxide layer 124 is formed in the passage 120 by thermal oxidation. The thermal oxidation may concurrently form an oxide layer 124a on the mask regions 116, the second active region 104a and in the trench 117 in the STI region 108a. The tunnel oxide layer 124 may have a thickness of about 50 Å. A charge trap layer 126 may be formed on the tunnel oxide 124 in the passage 120 using, for example, a CVD process. Concurrently with formation of the charge trap layer 126 in the passage 120, a charge trap layer 126a may be formed on the oxide layer 124a on the mask regions 116 and the second active region 104a and in the trench 117 in the STI region 108a. The charge trap layers 126, 126a may include, for example, silicon nitride layers having a thickness of about 200 Å. A dielectric layer 128 may be formed on the charge trap layer 126 in the passage 120 to a thickness of about 200 Å using thermal oxidation, which also forms a dielectric layer 128a on the charge trap layer 126a and the second active region 104a and in the trench 117 in the STI region 108a.

Figure 12:
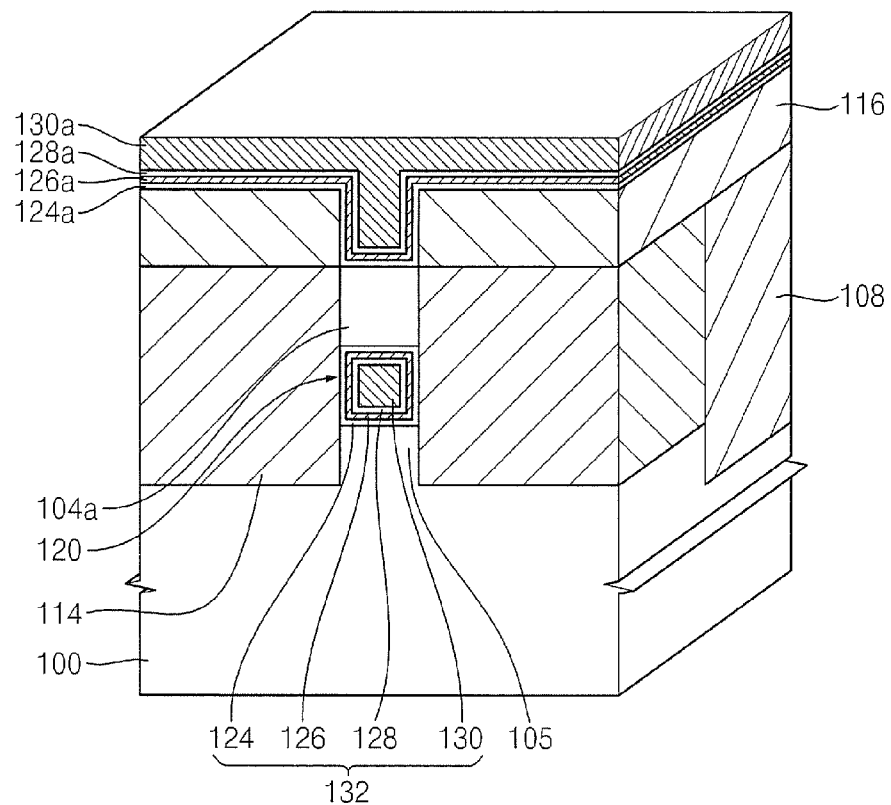

Referring to FIG. 12, a gate electrode 130 may be formed on the first dielectric layer 128 in the passage 120. The process used for forming the gate electrode 130 also forms a conductive layer 130a on the dielectric layer 128a and the second active region 104a and in the trench 117 in the STI region 108a. The gate electrode 130 and the conductive layer 130a may include, for example, polysilicon or metal. The gate electrode 130 and the conductive layer 130a may be formed by a CVD process.

Figure 13:
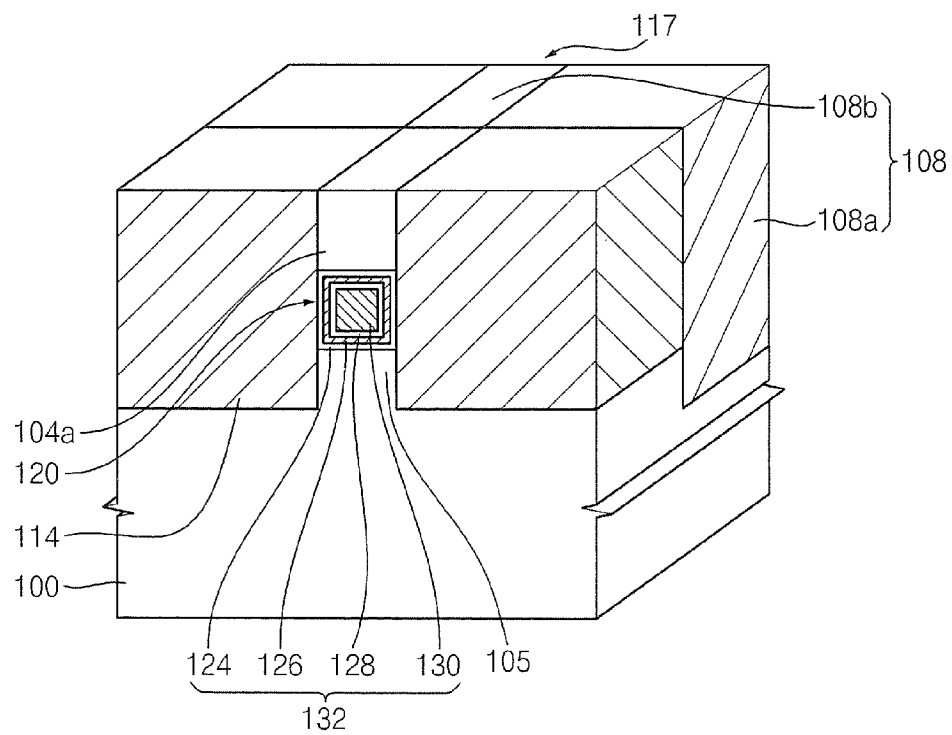

Referring to FIG. 13, portions of the conductive layer 130a, dielectric layer 128a, charge trap layer 126a and tunnel oxide layer 124a disposed on the mask regions 116 and in the trench 117 in the STI region 108a are removed using a CMP process and/or an etch back process. The mask regions 116 may then be removed using, for example, an etching process, to expose the semiconductor regions 114 and the second active region 104a. The trench 117 in the STI region 108a may be filled with insulating material using, for example, CVD and CMP, to form an STI region 108b in the trench 117, with the first and second STI regions 108a and 108b constituting an STI region 108.

Figure 14:
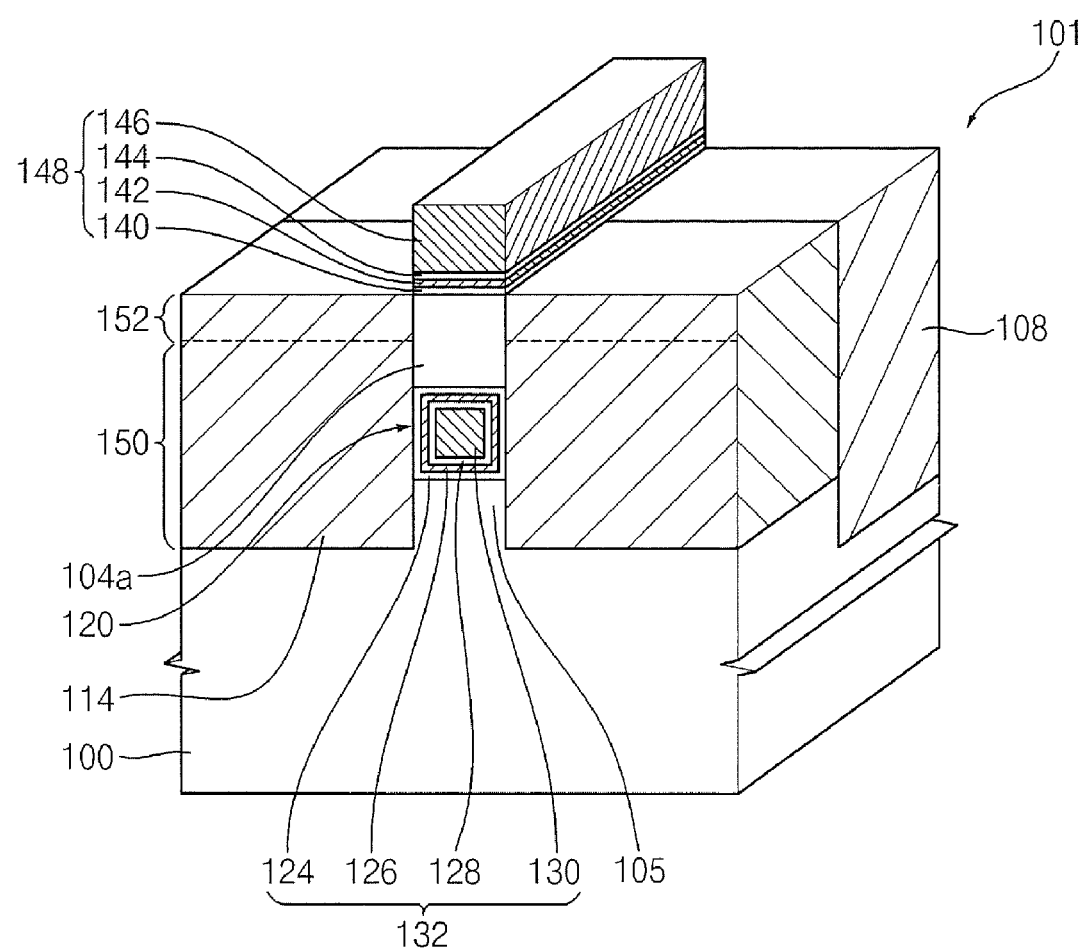

As shown in FIG. 14, a second gate structure 148 is formed on the second active region 104a. The second gate structure 148 may be formed by sequentially forming a tunnel oxide layer, a charge trap layer, a dielectric layer and a conductive layer, and patterning the layers to form a tunnel oxide pattern 140, a charge trap pattern 142, a dielectric pattern 144 and a gate electrode pattern 146. The second gate structure 148 may include a material composition similar to that of the first gate structure 132, or may utilize different materials and/or structures. For example, instead of the floating gate structure shown in FIG. 14, the second gate structure 148 may be, for example, a non-floating gate FET gate structure. Similarly, in further embodiments, the first gate structure 132 may be a non-floating gate FET structure. Further description of the structure illustrated in FIG. 14 is omitted in light of the foregoing description of FIG. 1.

Figure 15:
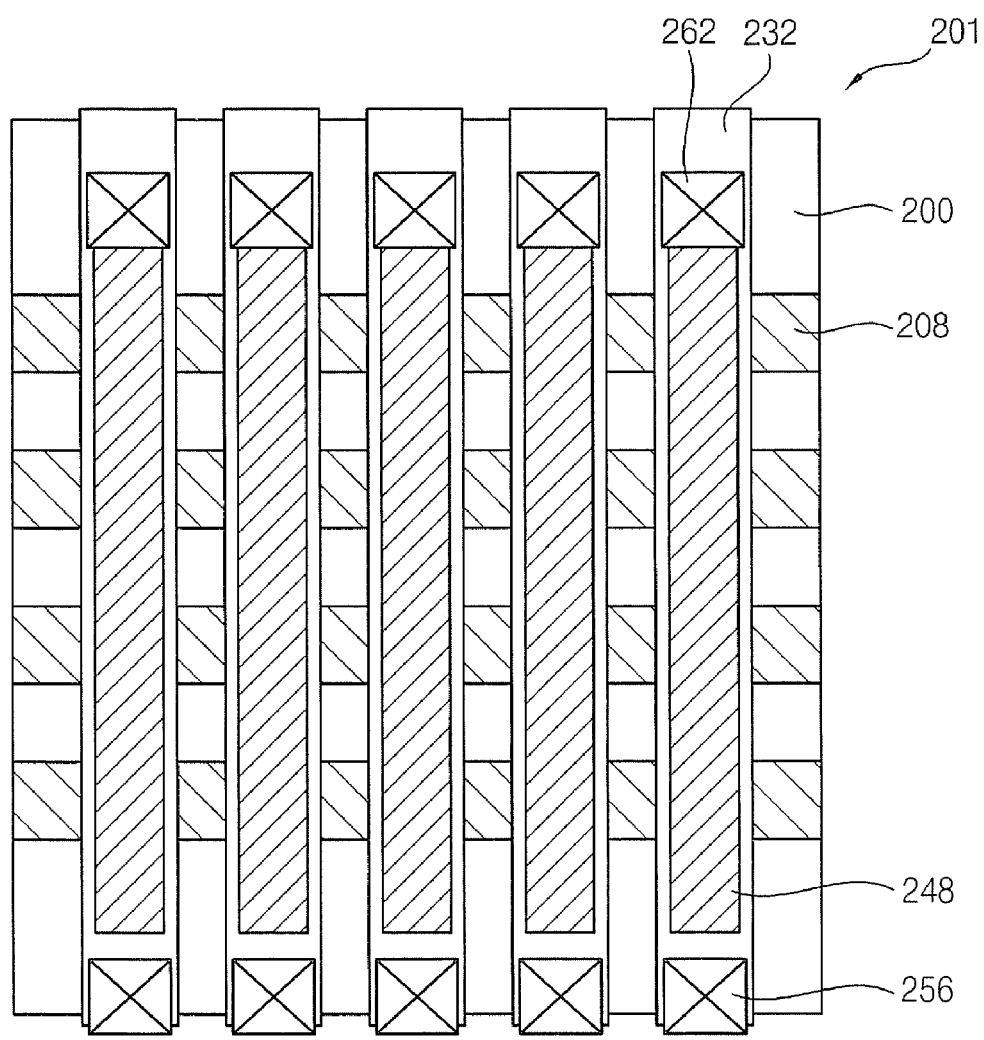
FIGS. 15 and 16 illustrate a nonvolatile memory device according to further embodiments of the present invention.
Figure 16:
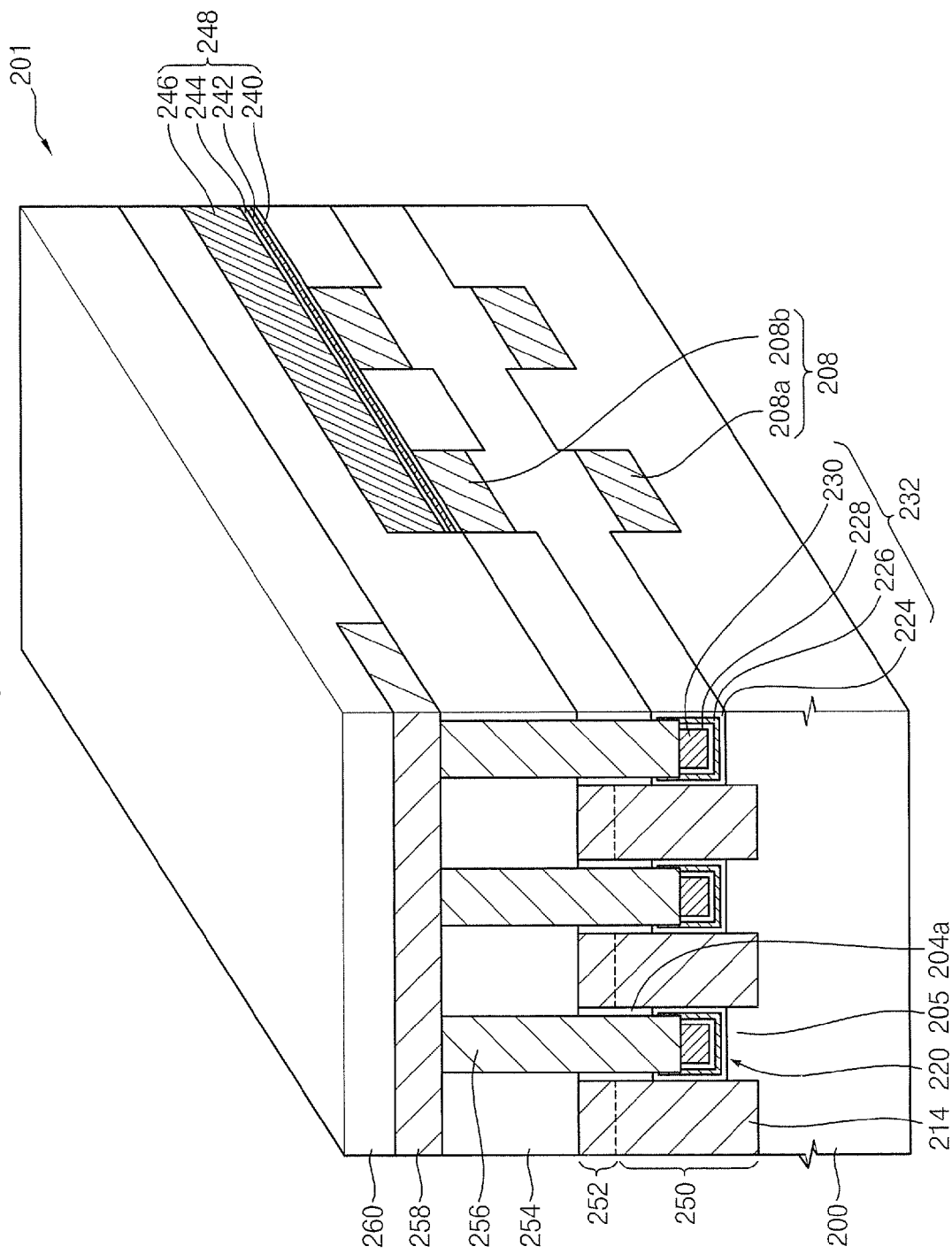

FIGS. 15 and 16 are plan and perspective views, respectively, of a non-volatile memory device 201 according to further embodiments of the present invention. Parallel first gate structures 232 are disposed in passages 220 between first active regions 205 and second active regions 204a on a substrate 200. Each of the first gate structures 232 includes a gate electrode 230 surrounded by a dielectric layer 228, a charge trap layer 226 and a tunnel oxide layer 224. Respective contact plugs 256 extend through an interlayer dielectric layer 254 to connect respective ones of the gate electrodes 230 to an overlying wiring pattern 256. The contact plugs 254 and wiring pattern 256 may be formed from a conductive metal, for example.

Respective second gate structures 248 are disposed on respective ones of the second active regions 204a. Each of the second gate structures 248 includes a conductive gate electrode 246 disposed on a dielectric pattern 244, a charge trap pattern 242 and a tunnel oxide pattern 240. As shown in FIG. 15, the second gate structures 248 extend substantially in parallel with the first gate structures 232, and are arranged in a staggered fashion such that the second gate structures 248 terminate short of the contact plugs 256 for the first gate electrodes 230. Respective contact plugs 262 extend through the first interlayer dielectric layer 254 and a second interlayer dielectric layer 260 to contact respective ones of the gate electrodes 246.

Respective semiconductor regions 214 are disposed between respective adjacent pairs of the first gate structures, and are bounded by STI regions 208 that extend transverse to the first and second gate structures 232, 248. The STI regions 208 include first and second portions 208a, 208b configured similarly to the STI regions 108 described above with reference to FIGS. 1-14. The semiconductor regions 214 are configured to support first and second source/drain subregions 250, 252 for respective vertical and planar transistors controlled by respective ones of the first gate structures 232 and second gate structures 248, in a manner similar to that discussed above with reference to FIGS. 1-14. It will be understood that the source/drain subregions 250, 252 may have respective different impurity concentrations, and may be formed using in situ doping and/or ion implantation.

Figure 17:
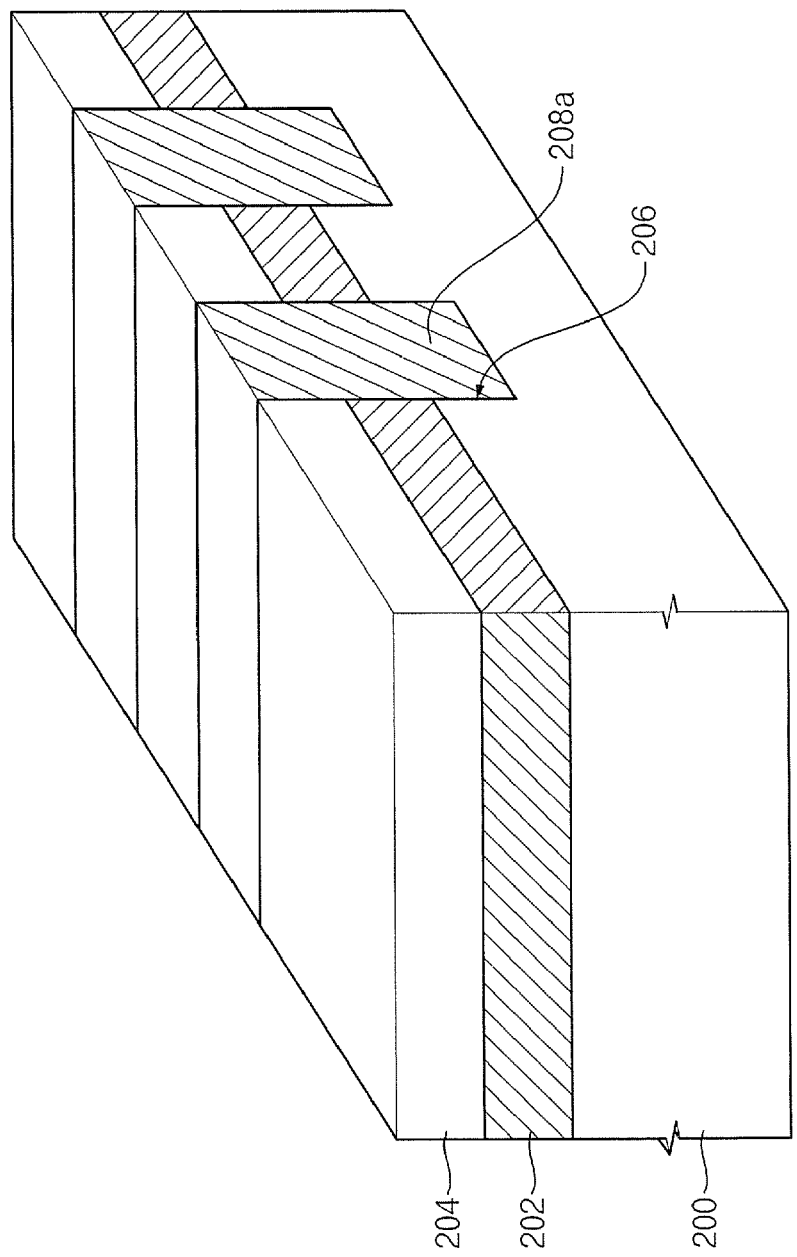
FIGS. 17-22 illustrate fabrication products illustrating operations for forming the memory device of FIGS. 15 and 16 according to some embodiments of the present invention.

FIGS. 17-22 illustrate operations for forming the non-volatile memory device of FIGS. 15 and 16 according to further embodiments of the present invention. Referring to FIG. 17, a sacrificial layer 202 is formed on a substrate 200 using, for example, an epitaxial process. The sacrificial layer 202 may include, for example, a SiGe layer. A single crystal silicon layer 204 is formed on the sacrificial layer 202 using, for example, an epitaxial process. Spaced-apart trenches 206 are formed in the structure including the substrate 200, the sacrificial layer 202 and the single crystal silicon layer 204. Respective STI regions 208a are formed in the trenches 206.

Figure 18:
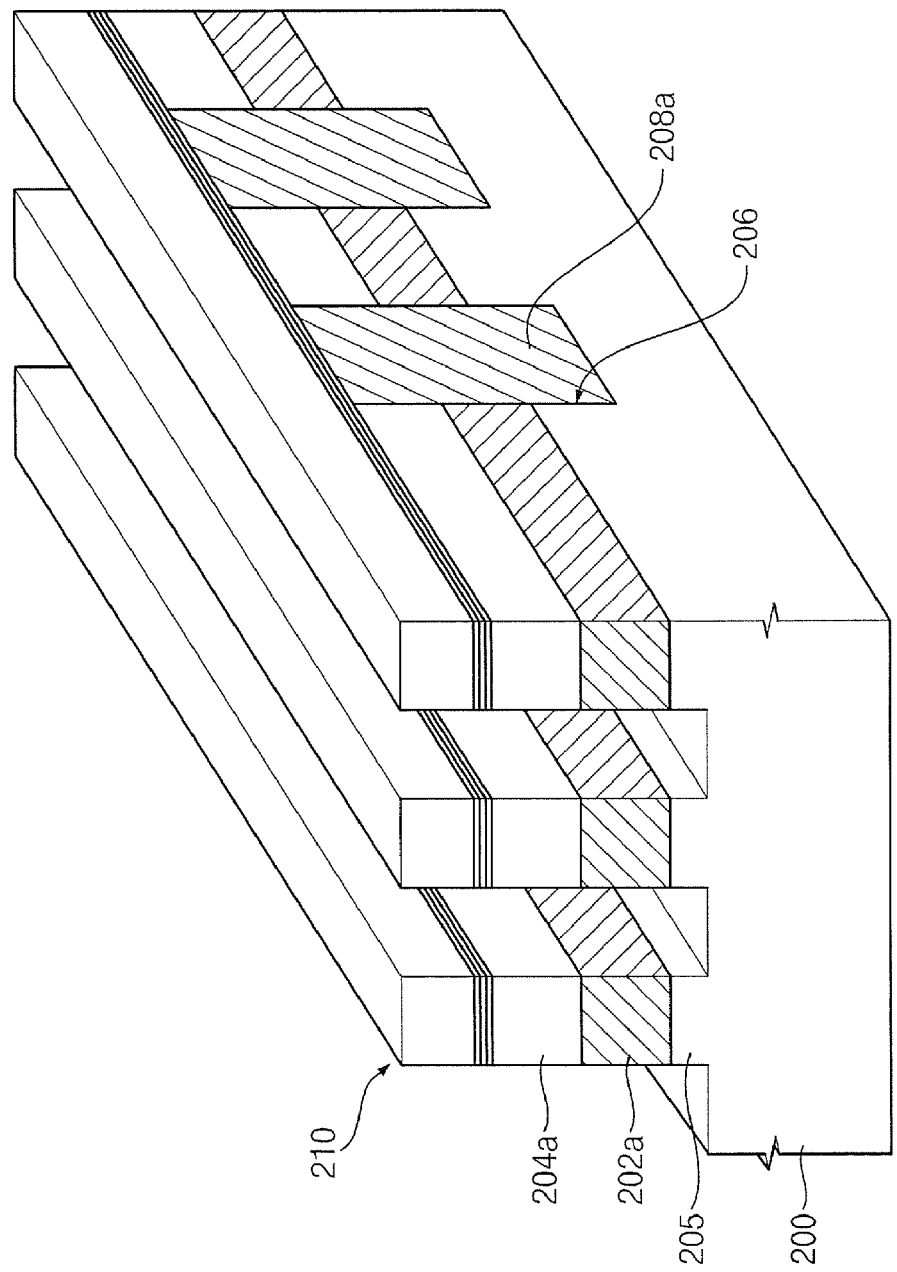

As shown in FIG. 18, a dummy gate structure 210 is formed on the silicon layer 204 and STIa regions 208 using, for example, a CVD process, a photo process and an etch process. First and second active regions 205, 204a and an intervening sacrificial pattern 202a are formed by etching using the dummy gate structure as an etching mask.

Figure 19:
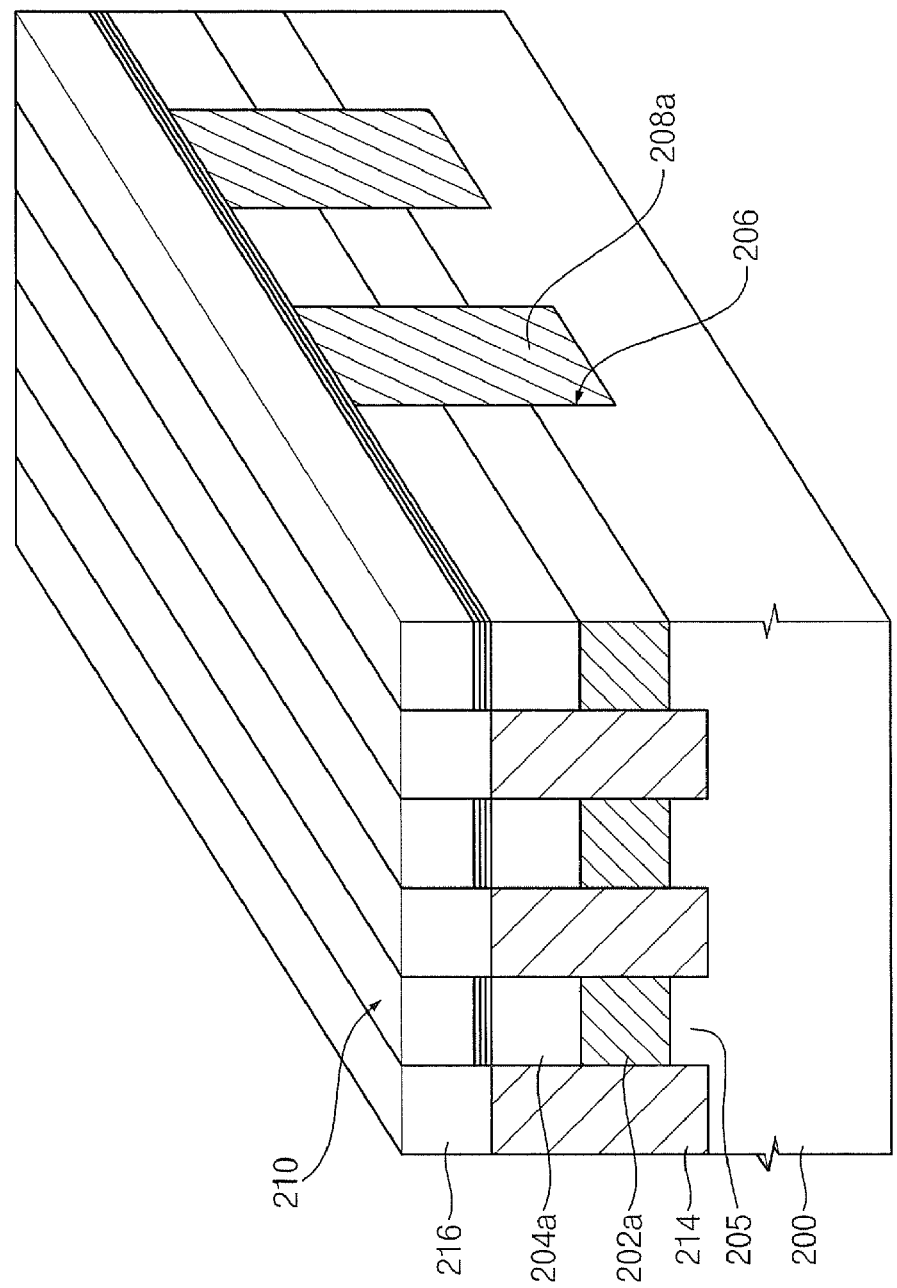
Figure 20:
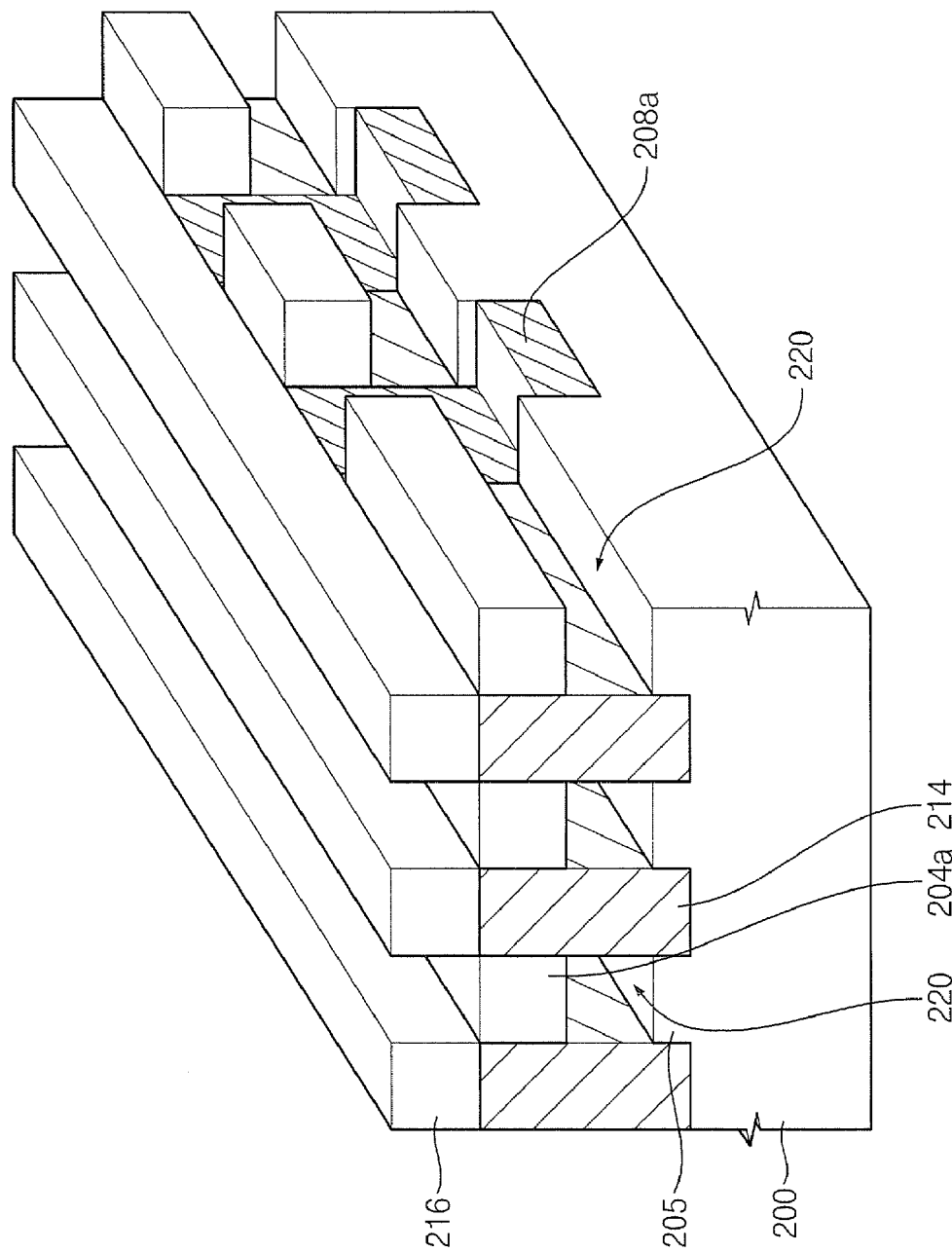

Referring to FIG. 19, semiconductor (e.g., silicon) regions 214 are formed adjacent the first active region 205, the sacrificial region 202a and the second active region 204a using, for example, an epitaxial process. In situ doping may be performed concurrent with formation of the semiconductor regions 214 and/or ion implantation may be used to define source/drain subregions in the semiconductor regions 214 in a subsequent process. Hard mask patterns 216 are formed on the semiconductor regions 214 and the STI regions 208a using, for example, a CVD and CMP process. The hard mask patterns 216 may include, for example, silicon nitride. Referring to FIG. 20, portions of the STI regions 208a exposed between the mask patterns 216 may be removed by an etching process to form trenches therein, and the sacrificial patterns 202a may be removed to form passages 220 that communicate with the trenches, along lines similar to those described above with reference to FIGS. 9 and 10.

Figure 21:
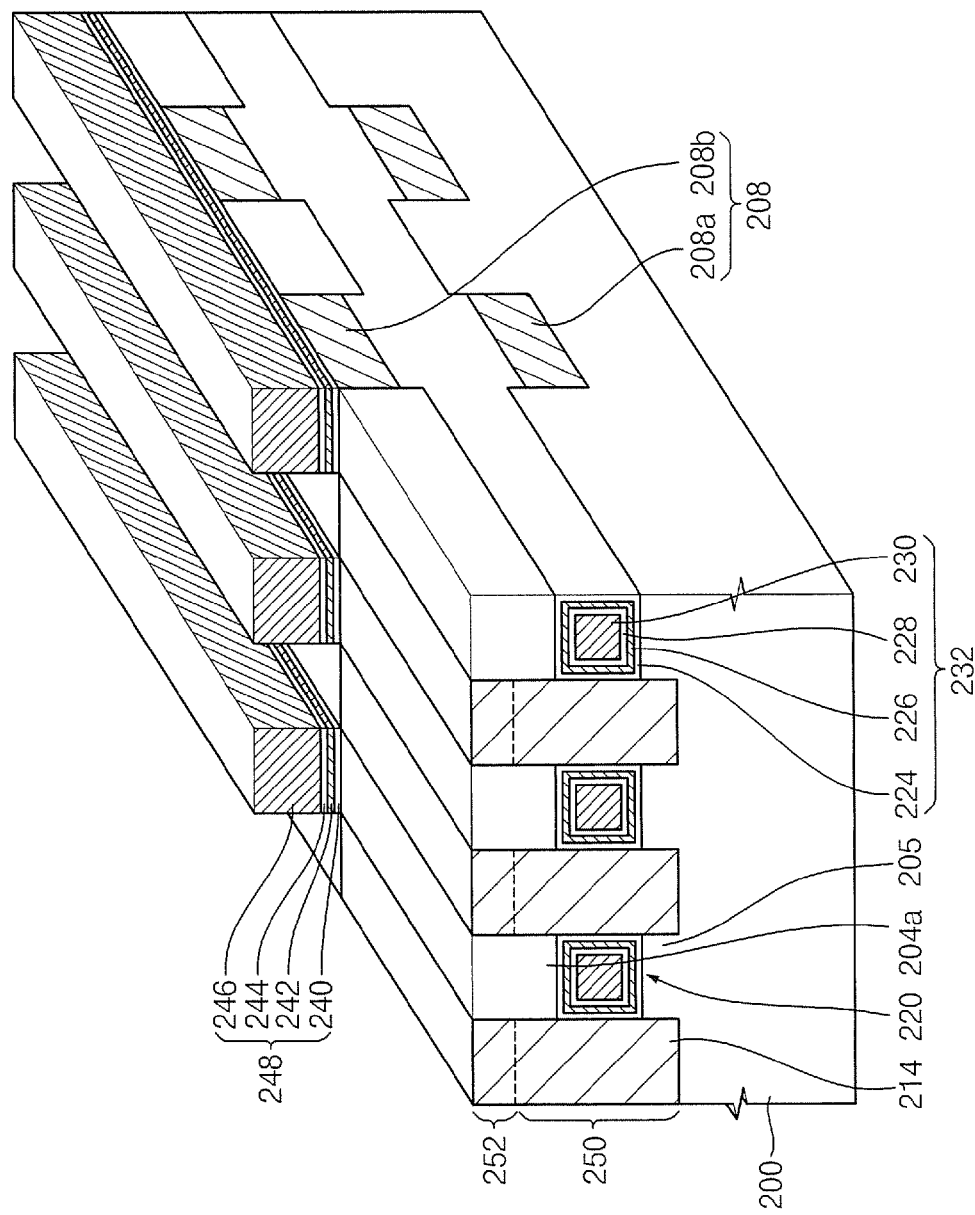

As shown in FIG. 21, the first gate structure 232 may be formed using operations along the lines discussed above with reference to FIGS. 10-13. A tunnel oxide layer 224 is formed in the passage 220 by thermal oxidation, which also causes formation of an oxide layer 240 on the second active regions 204a. The tunnel oxide layer 224 may have a thickness of about 50 Å. A charge trap layer 226 is formed on the tunnel oxide layer 224 using, for example, a CVD process. The charge trap layer 226 may be, for example, a silicon nitride layer having a thickness of about 200 Å. A dielectric layer 228 is formed on the charge trap layer 226 using, for example, thermal oxidation. The dielectric layer 228 may have a thickness of about 200 Å. A gate electrode 230 is formed on the dielectric layer 228.

The second gate structure 248 may be formed in a manner similar to that discussed above with reference to FIG. 13. Layers formed on the hard mask regions 216 and the second active regions 204a during formation of the first gate structure 232 may be removed, and STI regions 208b formed in the trenches in the STI regions 208a. Second gate structures 248, including stacked tunnel oxide, charge trap dielectric patterns 240, 242, 244, and a gate electrode 246 are formed on the active regions 204a.

Figure 22:
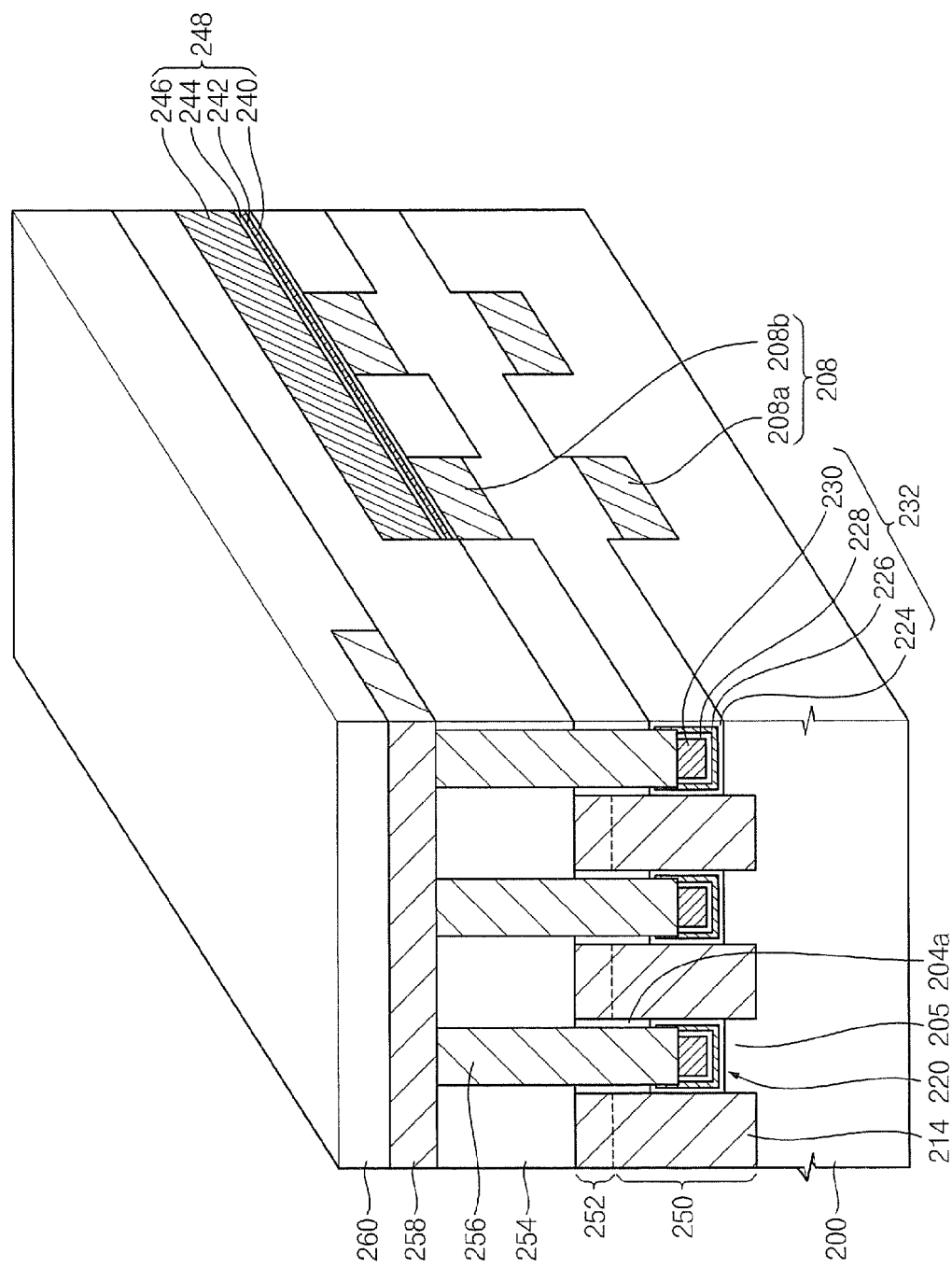

Referring to FIG. 22, a first ILD layer 254 may be formed using, for example, CVD and CMP. Contact plugs 256 are formed in openings in the first ILD layer 254, extending therethrough to contact the gate electrodes 230. A wiring pattern 258 is formed on the first ILD layer 254. A second ILD layer 260 is formed on the first ILD layer 254, covering the wiring pattern 258. Additional contact plugs for the gate electrodes 248 may be formed through the second ILD layer 260.

Figure 23:
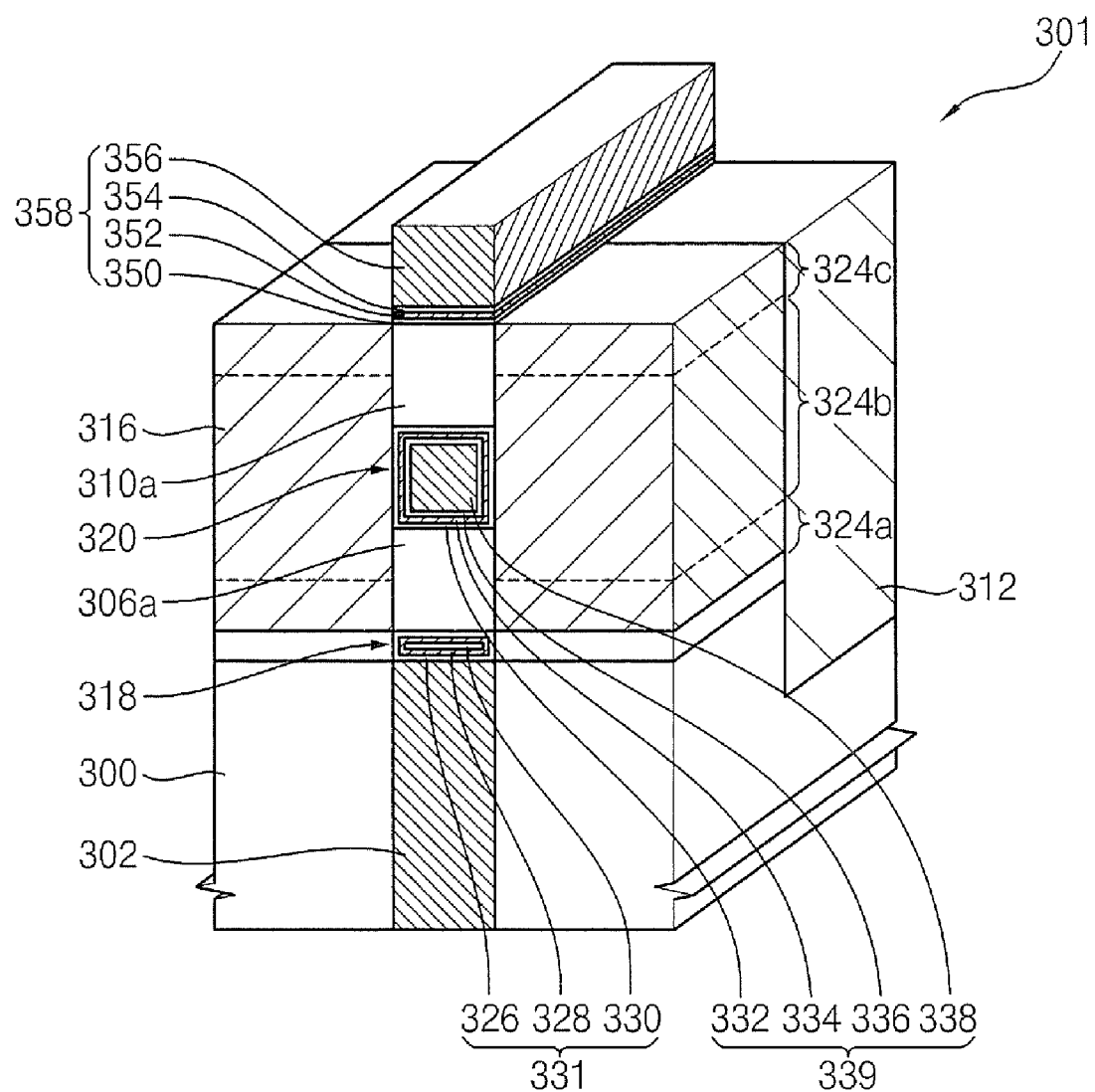
FIG. 23 illustrates a nonvolatile memory device according to some embodiments of the present invention.

FIG. 23 illustrates a non-volatile memory device 301 according to further embodiments of the present invention. The device 301 is similar to the device 101 of FIG. 1, except for formation of a second planar transistor controlled by a control gate structure 331 formed in an additional passage 318.

In particular, referring to FIG. 23, the device 301 includes a doped control gate region 302 formed in a substrate 300. A charge trap structure 331 is disposed in a passage 318 between the doped control gate region 302 and a first active region 306, and includes a dielectric layer 330 surrounded by a charge trap layer 328 and a tunnel oxide layer 326. A first gate structure 339, including a gate electrode 338 surrounded by a dielectric layer 336, a charge trap layer 334 and a tunnel oxide layer 332, is disposed between the first active region 306a and a second active region 310a. A second gate structure 358, including a gate electrode 356 disposed on a dielectric pattern 354, a charge trap pattern 352 and a tunnel oxide pattern 350, lies on the second active region 310a.

Source/drain regions 316 are disposed on respective sides of the first active region 306a, the first gate structure 339 and the second active region 310a. This arrangement provides a first planar transistor including source/drain subregions 324a and a gate structure including the doped control gate region 302 and the charge trap structure 331, a vertical transistor including source/drain subregions 324b and the first gate structure 339, and a second planar transistor including source/drain subregions 324c and the second gate structure 358. The source/drain regions 316 are bounded by an STI region 312.

Figure 24:
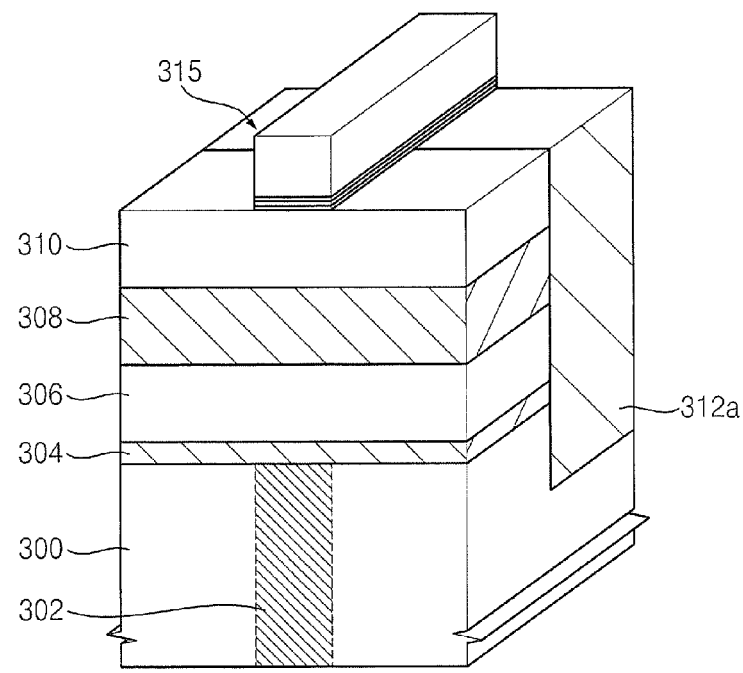
FIGS. 24-27 illustrate fabrication products illustrating operations for forming the memory device of FIG. 23 according to some embodiments of the present invention.

FIGS. 24-27 illustrate operations for forming the device 301 according to some embodiments of the present invention. Referring to FIG. 24, a doped control gate region 302 is formed in a substrate 300 using, for example, ion implantation. A first sacrificial layer 304 is formed on a substrate 300 using, for example, an epitaxial process. The first sacrificial layer 304 may include, for example, a SiGe layer.

A first single crystal silicon layer 306 is formed on the sacrificial layer 304 using, for example, an epitaxial process. A second sacrificial layer 308, e.g. a SiGe layer, is formed on the first single crystal layer 306 using, for example, an epitaxial process. A second single crystal silicon layer 310 is formed on the second sacrificial layer 308. A trench is formed through the stacked layers, and an STI region 312a is formed in the trench. A dummy gate structure 315 is formed on the second silicon layer 310 and STI region 312a using, for example, a CVD, photo and etch process.

Figure 25:
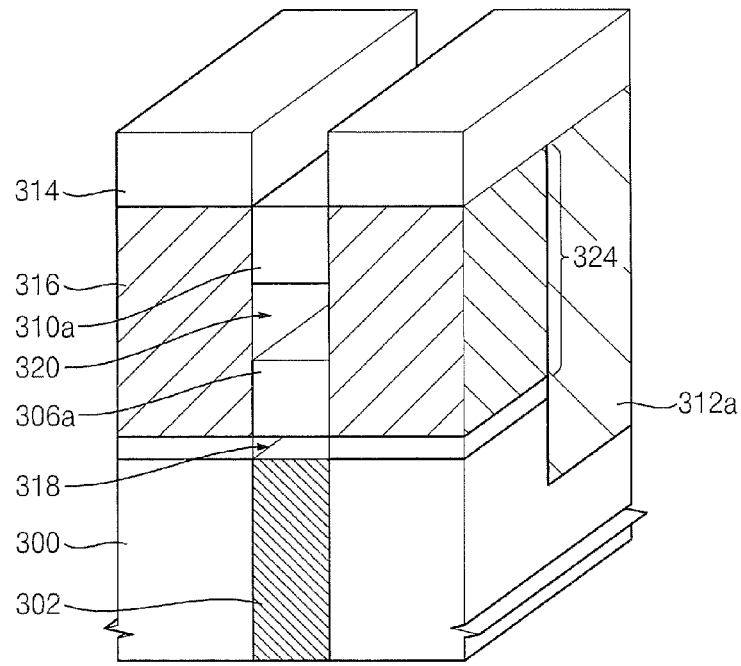

Referring to FIG. 25, using the dummy gate structure 315 as an etching mask, a stack including a first active region 306a, a sacrificial region, and a second active region 310a, is formed. Semiconductor regions 316 are formed adjacent the active regions 306a, 310a using, for example, an epitaxial process. The semiconductor regions 316 may be in situ doped to define source/drain subregions therein and/or may be subsequently implanted with ions to define source/drain subregions therein. Hard mask patterns 314 are formed on semiconductor regions 316 and the STI region 312 using, for example, a CVD and CMP process. The mask regions 314 may include silicon nitride.

The sacrificial region between the active regions 306a, 310a and a portion of the sacrificial layer 304 between the semiconductor regions 314 are removed to form first and second passages 318, 320. A portion of the STI region 312a between the mask patterns 314 is etched to form a trench in the STI region 312a that is in communication with the passages 318, 320, along lines discussed above.

Figure 26:
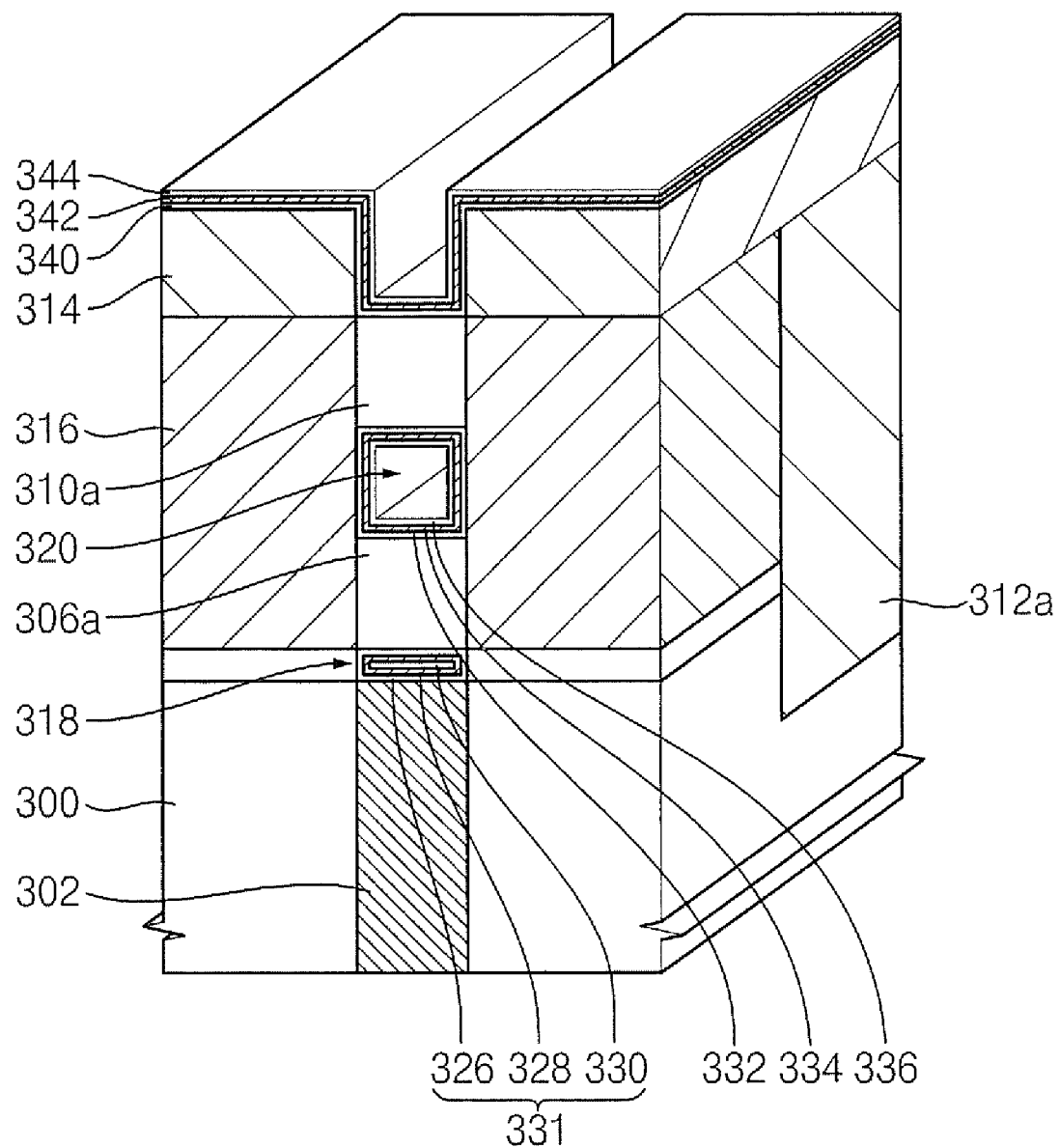

Referring to FIG. 26, tunnel oxide layers 326, 332 are formed in the passages 318, 320 by thermal oxidation. The tunnel oxide layers 326, 332 may have a thickness of about 50 Å. The thermal oxidation process may also form an oxide layer 340 on the mask patterns 316 and the second active region 310. Charge trap layers 328, 334 are formed in the passages 318, 320, on the tunnel oxide layers 326, 332 using, for example, a CVD process, which may also form a charge trap material layer 342 on the oxide layer 340. The charge trap layers 328, 334 may include silicon nitride layers having a thickness of about 200 Å. Dielectric layers 330, 336 may be formed on the charge trap layers 328, 334 using a thermal oxidation process, which may also form a dielectric layer 344 on the charge trap material layer 342. The dielectric layers 330, 336 may have a thickness of about 200 Å.

Figure 27:
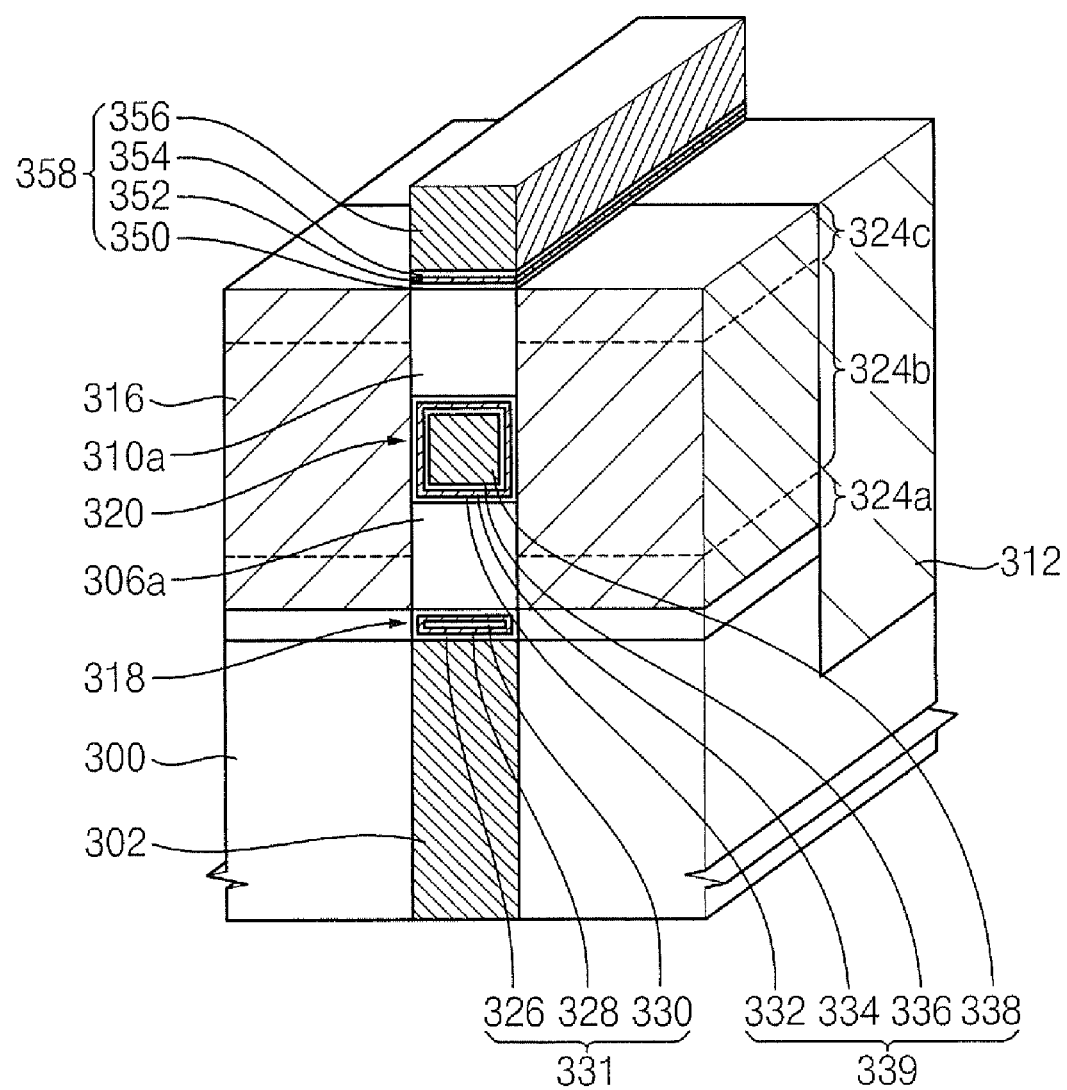

Referring to FIG. 27, a gate electrode 338 is formed in the second passage 320, on the dielectric layer 336. The deposition process for the gate electrode 338 may also form a conductive layer on the dielectric layer 344. This conductive layer, along with the underlying layers 340, 342, 344 and the mask patterns 316 may be removed, and a STI region formed in a resulting trench in the STI region 312a filled to form a completed STI region 312, along lines described above with reference to FIG. 13. A second gate structure 331, including a tunnel oxide pattern 350, a charge trap pattern 352, a dielectric pattern 354 and a gate electrode 356 may be formed on the second active region 310a using, for example, techniques along lines discussed above.

Figure 28:
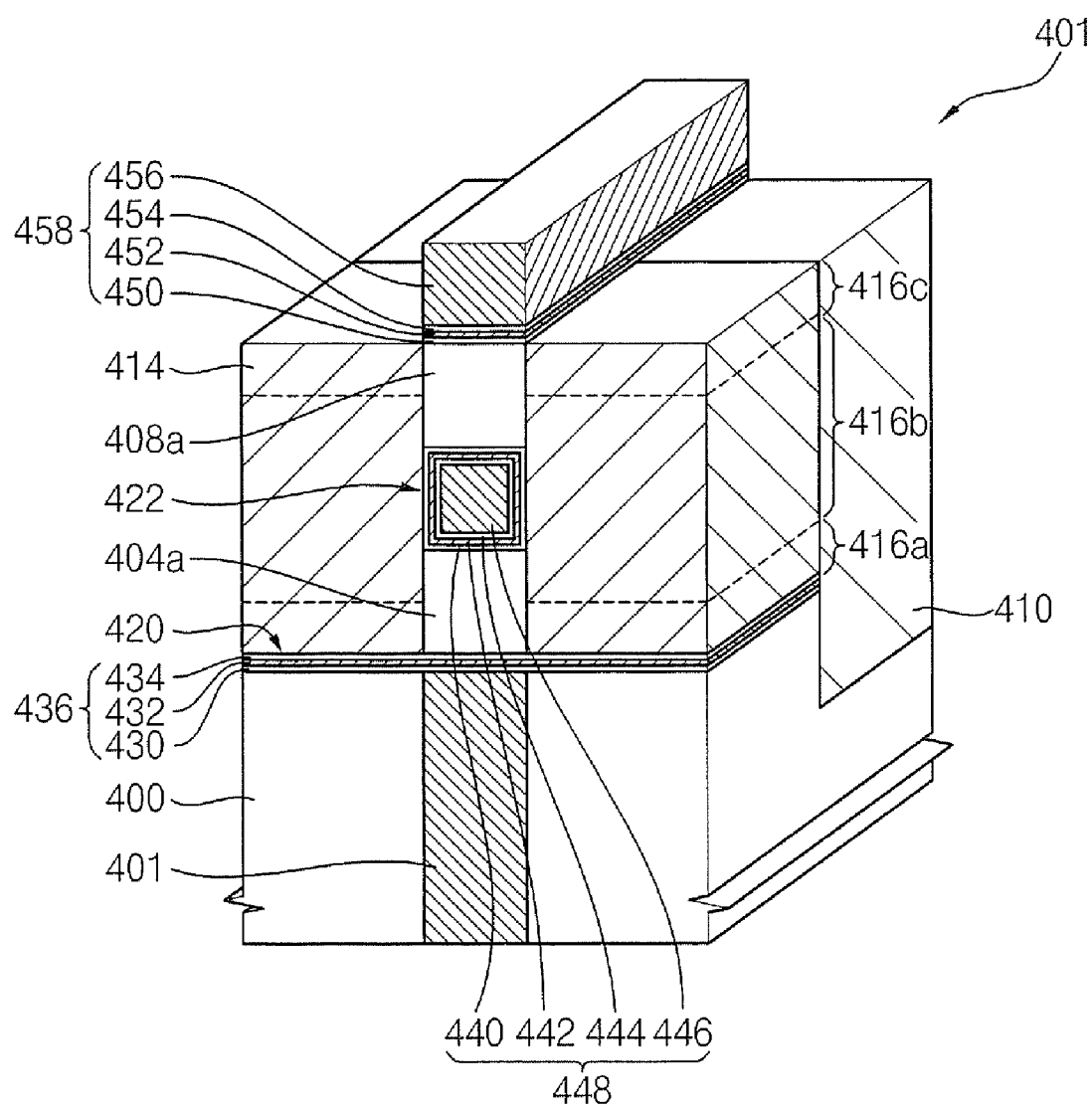
FIG. 28 illustrates a nonvolatile memory device according to some embodiments of the present invention.

FIG. 28 illustrates a non-volatile memory device 401 according to still further embodiments of the present invention. The device 401 is similar to the device 301 of FIG. 23, except that it includes a charge trap structure 436 that extends to underlie a first active region 404a and adjacent source/drain regions 414. The device 401 includes a substrate 400 including a doped control gate region 402 therein. A charge trap structure 436, including a dielectric layer 430, a charge trap layer 432 and a tunnel oxide layer 434, is disposed on the substrate 400, in a passage 420 substantially centered over the control gate region 402. A first active region 404a is disposed on the charge trap structure 436, overlying the control gate region 402. A first gate structure 448, including a gate electrode 446 surrounded by a dielectric layer 444, a charge trap layer 442 and a tunnel oxide layer 440, is disposed on the first active region 404a, in a passage 422. A second active region 408a is disposed on the first gate structure 448. A second gate structure 458, including a gate electrode 456 disposed on a dielectric pattern 454, a charge trap pattern 452 and a tunnel oxide pattern 450, is disposed on the second active region 408a. Source/drain regions 414 are disposed on respective sides of the stack including the first active region 404a, the first gate structure 448 and the second active region 408a, and include source/drain subregions 416a, 416b, 416c for a first planar transistor including the control gate region 402 and charge trap structure 436, a vertical transistor including the first gate structure 448 and a second planar transistor including the second gate structure 458, respectively. These subregions may be formed in manner similar to that described above. The source/drain regions 414 are bounded by an STI region 410.

Figure 29:
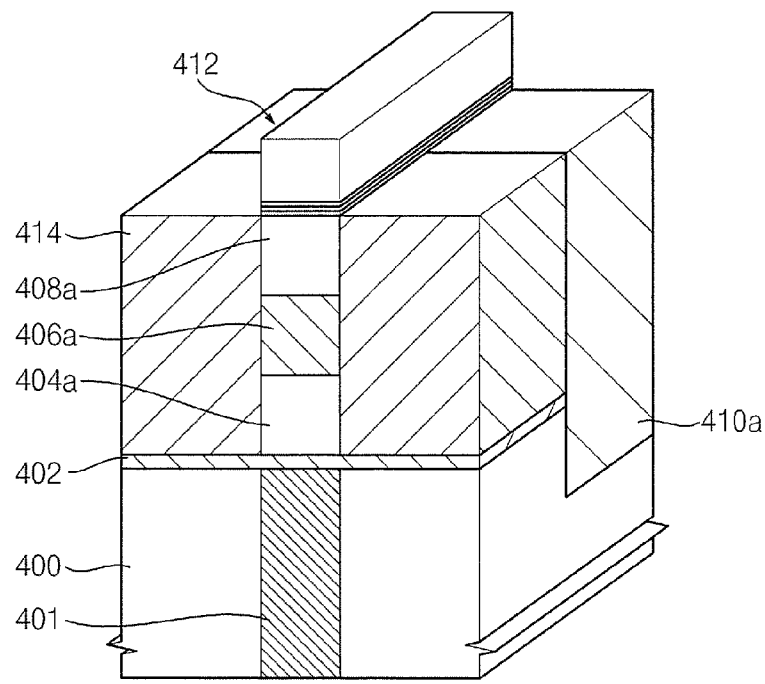
FIGS. 29 and 30 illustrate fabrication products illustrating operations for forming the memory device of FIG. 28 according to some embodiments of the present invention.
Figure 30:
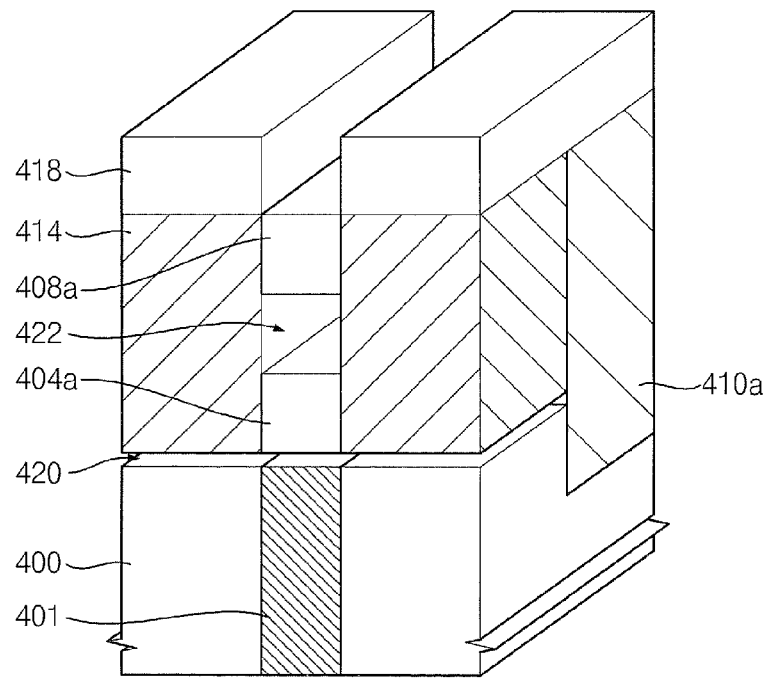

Referring to FIG. 29, a doped control gate region 402, active regions 404a, 408a, sacrificial regions 402a, 406a, semiconductor regions 414, a STI region 412a and a dummy gate structure 412 are formed using techniques along lines discussed above with reference to FIGS. 23-27. The sacrificial regions 402a, 406a are removed to form the passages 420, 422. The charge trap region 436 and first gate structure 448 may be formed in the passages 420, 422, using techniques along the lines of those discussed above. The STI region 412 and second gate structure 458 may be fabricated as discussed above.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A memory device, comprising:
   a first active region on a substrate;
   first and second source/drain regions on the substrate, the first and second source/drain regions abutting respective first and second sidewalls of the first active region;
   a first gate structure of a first transistor on the first active region and between the first and second source/drain regions;
   a second active region on the first gate structure, wherein the second active region is disposed between and abutting the first and second source/drain regions and wherein the first and second active regions are disposed on opposite sides of the first gate structure; and
   a second gate structure of a second transistor on the second active region overlying the first gate structure, wherein the first active region comprises a portion of the substrate protruding between the first and second source/drain regions.

2. The memory device of claim 1, wherein the first gate structure comprises:
   a first elongated conductive gate electrode;
   a dielectric layer surrounding the first elongated conductive gate electrode;
   a charge trap layer surrounding the dielectric layer and the first elongated conductive gate electrode; and
   a tunnel oxide layer surrounding the charge trap layer, the dielectric layer, and the first elongated conductive gate electrode.

3. The memory device of claim 2, wherein the second gate structure comprises:
   a tunnel oxide pattern on the second active region;
   a charge trap pattern on the tunnel oxide pattern;
   a dielectric pattern on the charge trap pattern; and
   a second elongated conductive gate electrode on the dielectric pattern and substantially parallel to the first elongated conductive gate electrode.

4. The memory device of claim 1, wherein each of the first and second source/drain regions comprises:
   a first subregion disposed adjacent the second gate structure and having a first impurity concentration; and
   a second subregion adjacent the first gate structure and having a second impurity concentration.

5. The memory device of claim 1, wherein the first and second source/drain regions comprise single crystal semiconductor regions.

6. The memory device of claim 1, wherein the first and second source/drain regions are bounded by spaced-apart trench isolation regions.

7. The memory device of claim 1, wherein the first and second gate structures are substantially parallel elongated gate structures, wherein a portion of the first gate structure extends beyond an end of the second gate structure, and wherein the memory device further comprises:
   an interlayer dielectric (ILD) layer covering the second gate structure; and
   a conductive wiring structure disposed on the ILD layer and having a contact plug extending through the ILD layer to contact the portion of the first gate structure that extends beyond the end of the second gate structure.

8. The memory device of claim 1; further comprising a third gate structure underlying the first active region.

9. The memory device of claim 8, wherein the third gate structure comprises:
   a charge trap structure underlying the first active region; and
   a doped control gate region in the substrate underlying the charge trap structure.

10. The memory device of claim 9, wherein the charge trap structure comprises a charge trap layer surrounded by a tunnel oxide layer.

11. The memory device of claim 9, wherein the charge trap structure underlies the first active region between the first and second source/drain regions.

12. The memory device of claim 9, wherein the charge trap structure extends to underlie the first and second source/drain regions and the first active region.

13. The memory device of claim 9, wherein each of the first and second source/drain regions comprises:
   a first subregion adjacent the second gate structure and having a first impurity concentration;
   a second subregion adjacent the first gate structure and having a second impurity concentration; and
   a third subregion adjacent the third gate structure and having a third impurity concentration.

14. The memory device of claim 1, wherein the first gate structure comprises:
   a first elongated conductive gate electrode;
   a dielectric layer surrounding the first elongated conductive gate electrode;
   a charge trap layer surrounding the dielectric layer and the first elongated conductive gate electrode; and
   a tunnel oxide layer surrounding the charge trap layer, the dielectric layer, and the first elongated conductive gate electrode.

15. The memory device of claim 14, wherein the second gate structure comprises:
   a tunnel oxide pattern on the second active region;
   a charge trap pattern on the tunnel oxide pattern;
   a dielectric pattern on the charge trap pattern; and
   a second elongated conductive gate electrode on the dielectric pattern and substantially parallel to the first elongated conductive gate electrode.

16. The memory device of claim 1, wherein each of the first and second source/drain regions comprises:
   a first subregion disposed adjacent the second gate structure and having a first impurity concentration; and
   a second subregion adjacent the first gate structure and having a second impurity concentration.

17. The memory device of claim 1, wherein the first and second source/drain regions comprise single crystal semiconductor regions.

18. The memory device of claim 1, wherein the first and second source/drain regions are bounded by spaced-apart trench isolation regions.

19. The memory device of claim 1, wherein the first and second gate structures are substantially parallel elongated gate structures, wherein a portion of the first gate structure extends beyond an end of the second gate structure, and wherein the memory device further comprises:

an interlayer dielectric (ILD) layer covering the second gate structure; and
a conductive wiring structure disposed on the ILD layer and having a contact plug extending through the ILD layer to contact the portion of the first gate structure that extends beyond the end of the second gate structure.

* * * * *